United States Patent
Soliman et al.

(10) Patent No.: US 12,463,637 B2
(45) Date of Patent: Nov. 4, 2025

(54) METHOD FOR PROCESSING INPUT VARIABLES BY MEANS OF A PROCESSING DEVICE HAVING AT LEAST ONE TRANSISTOR, DEVICE FOR EXECUTING THE METHOD, COMPUTING DEVICE, AND USE

(71) Applicant: Robert Bosch Gmbh, Stuttgart (DE)

(72) Inventors: Taha Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 33 days.

(21) Appl. No.: 18/640,713

(22) Filed: Apr. 19, 2024

(65) Prior Publication Data

US 2024/0364329 A1  Oct. 31, 2024

(30) Foreign Application Priority Data

Apr. 26, 2023 (DE) ...................... 10 2023 203 874.9

(51) Int. Cl.
H03K 17/687 (2006.01)
(52) U.S. Cl.
CPC ................................. H03K 17/687 (2013.01)
(58) Field of Classification Search
CPC .................................................... H03K 17/687

USPC ......................................................... 327/109
See application file for complete search history.

(56) References Cited

U.S. PATENT DOCUMENTS

2024/0313779 A1*  9/2024  Soliman ............. G11C 13/0002
2024/0348246 A1*  10/2024 Soliman ............... H03K 17/162

FOREIGN PATENT DOCUMENTS

CN          114741050 A      7/2022
DE       102020210737 A1     3/2022

* cited by examiner

Primary Examiner — Tomi Skibinski
(74) Attorney, Agent, or Firm — NORTON ROSE FULBRIGHT US LLP

(57) ABSTRACT

A method for processing input variables using a processing device having at least a first transistor, for example a field-effect transistor. The method includes: providing the first transistor and a first memristive circuit device which characterizes a first input variable associated with the first transistor, wherein a charging current of a capacitor associated with a control electrode of the first transistor can be influenced by means of the first memristive element; applying to the control electrode of the first transistor a first control signal which characterizes a second input variable associated with the first transistor and which has at least periodically a non-constant amplitude; ascertaining a first output variable on the basis of a first variable characterizing a time curve of a current through a load path of the first transistor.

34 Claims, 21 Drawing Sheets

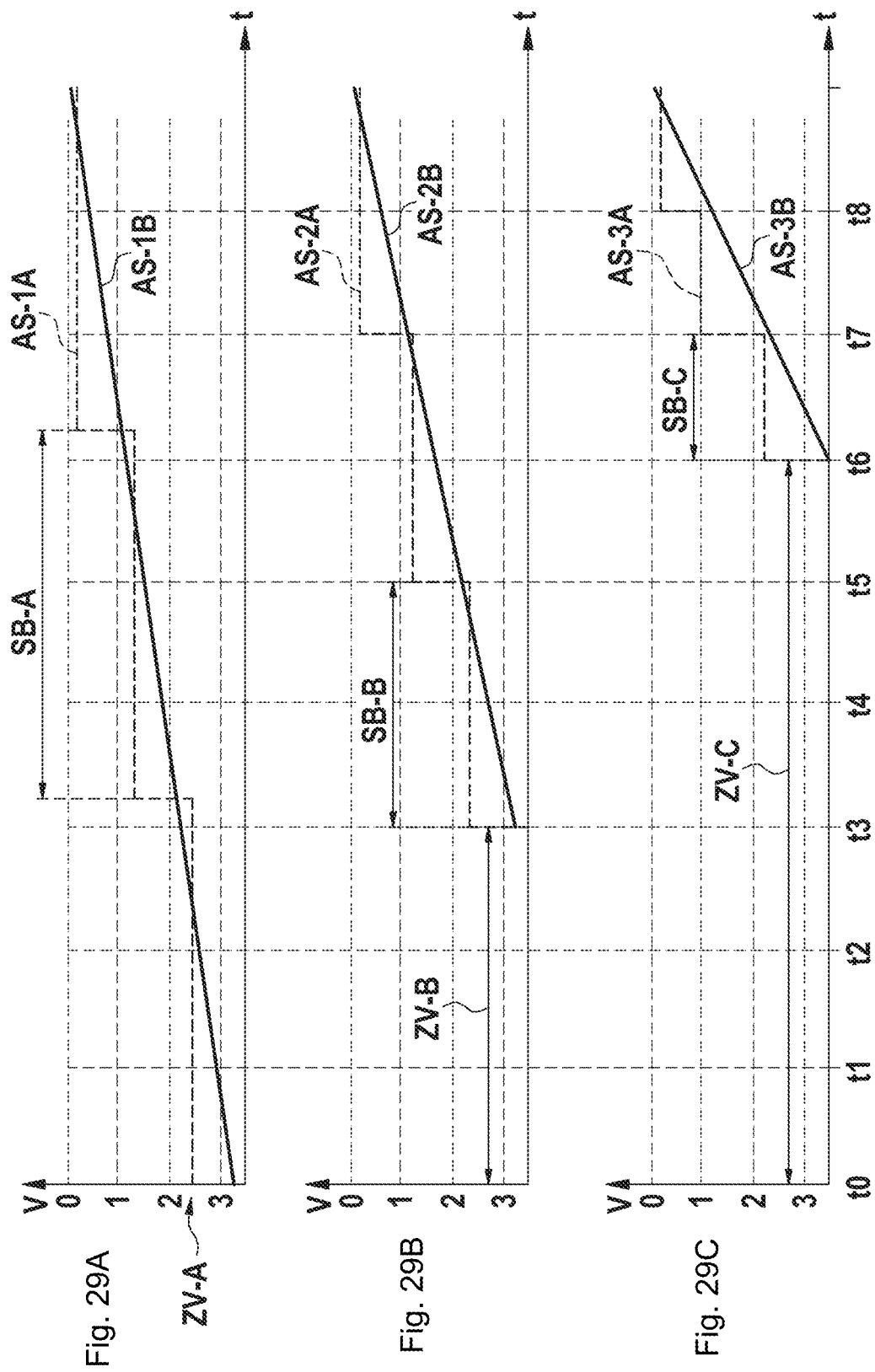

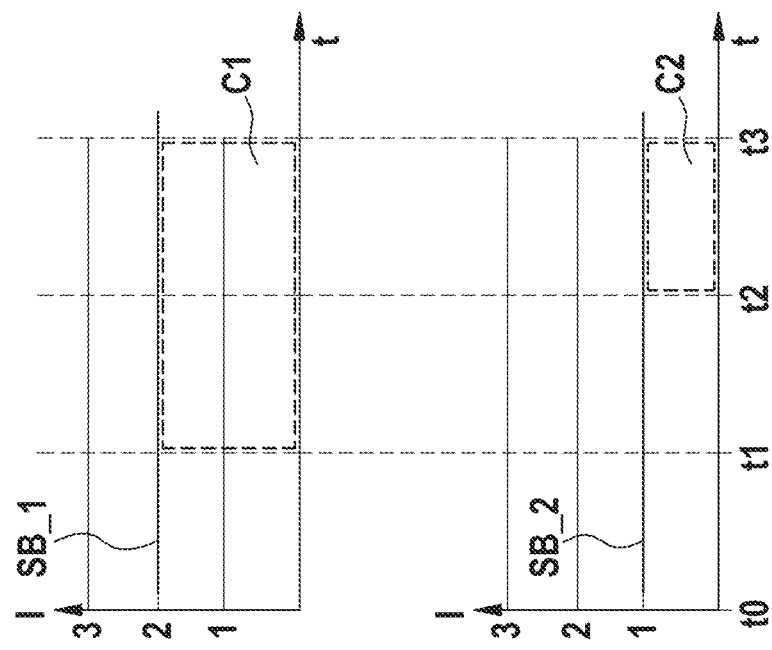
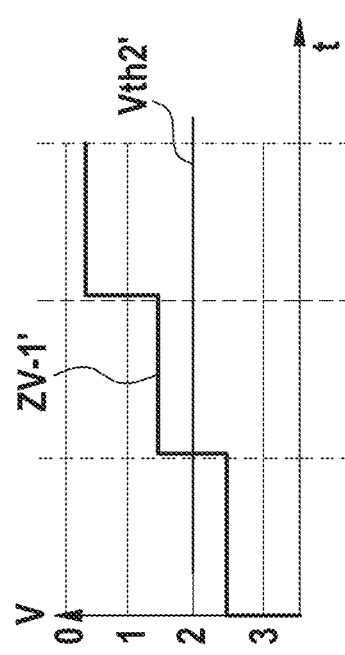
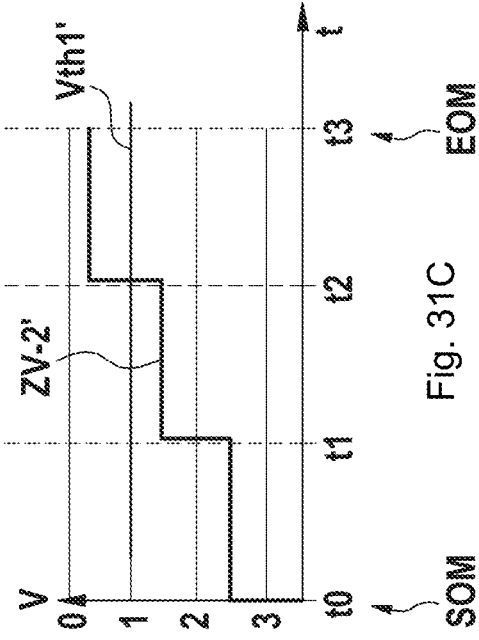

METHOD FOR PROCESSING INPUT VARIABLES BY MEANS OF A PROCESSING DEVICE HAVING AT LEAST ONE TRANSISTOR, DEVICE FOR EXECUTING THE METHOD, COMPUTING DEVICE, AND USE

FIELD

The present invention relates to a method for processing input variables using a processing device having at least one transistor.

The present invention further relates to a device for executing a method for processing input variables by means of a processing device having at least one transistor.

SUMMARY

Exemplary embodiments of the present invention relate to a method for processing input variables by means of a processing device having at least a first transistor, for example a field-effect transistor, comprising: providing the first transistor and a first memristive circuit device which characterizes a first input variable associated with the first transistor, wherein a charging current of a capacitance associated with, for example connected to, a control electrode of the first transistor can be influenced by means of the first memristive circuit device; applying to the control electrode of the first transistor a first control signal which characterizes a second input variable associated with the first transistor and which has at least periodically a non-constant amplitude; ascertaining a first output variable on the basis of a first variable characterizing a time curve of a current through a load path of the first transistor.

In further exemplary embodiments of the present invention, for example, in this way a calculation based on the first input variable and the second input variable can be carried out using the transistor, i.e., for example in a hardware-based manner.

In further exemplary embodiments of the present invention, the first input variable can for example characterize or represent a digital (e.g. discrete-value) input value, which can be realized for example by a state of the first memristive circuit device, e.g. by corresponding programming of at least one memristive element of the first memristive circuit device.

In further exemplary embodiments of the present invention, the second input variable can for example characterize or represent a digital (e.g. discrete-value) input value. In further exemplary embodiments, the first transistor can be activated for example for a specifiable time (i.e., its load path can be set to a low-impedance state, for example) based on the first control signal or the second input variable, wherein the specifiable time is for example proportional to the first control signal. The same can also apply for example to the multiple transistors in other exemplary embodiments with multiple transistors.

In further exemplary embodiments of the present invention, the first transistor has a threshold voltage, for example a fixed threshold voltage, wherein an activation of the first transistor can be influenced for example by the first memristive circuit device, for example by a voltage divider device with at least one memristive element. Thus, in further exemplary embodiments, for example, the first transistor may appear to have a different threshold voltage than its e.g. fixed threshold voltage, for example based on a state of the first memristive circuit device. The same can also apply for example to the multiple transistors in other exemplary embodiments with multiple transistors.

In further exemplary embodiments of the present invention, at least one transistor with a variable, for example programmable, threshold voltage can also be used, such as a ferroelectric field-effect transistor, FeFET. For the following description of exemplary embodiments, however, without limiting the generality, at least one transistor with a fixed threshold voltage is assumed (and not for example FeFET (s)).

In further exemplary embodiments of the present invention, it is provided that the first variable is at least one of the following elements: a) the current through the load path itself; b) a voltage that can be ascertained based at least on the current through the load path, such as can be obtained for example by charging or recharging a capacitance, for example by means of the current through the load path.

In further exemplary embodiments of the present invention, it is provided that the method comprises at least one of the following elements: a) using an intrinsic and/or parasitic capacitance, for example a Miller capacitance of the first transistor, as the capacitance associated with the control electrode of the first transistor; b) providing an external, for example non-intrinsic, capacitance, for example in addition to a or the intrinsic capacitance, for the capacitance associated with the control electrode of the first transistor.

As an alternative or in addition to the intrinsic Miller capacitance, for example, in further exemplary embodiments of the control electrode, a further capacitance can thus be assigned, for example for setting a prespecifiable capacitance value. In further exemplary embodiments, it is also possible to adjust the intrinsic capacitance within the framework of manufacturing conditions during a manufacturing process. In further exemplary embodiments, the charging of the above-described capacitance makes possible a defined activation of the transistor, i.e., for example, a shifting of the transistor from a, for example, blocking (high-impedance) state into a conductive (low-impedance) state.

In further exemplary embodiments of the present invention, it is provided that the method comprises: switching the first memristive circuit device in series with the control electrode of the first transistor; applying the first control signal to the control electrode of the first transistor via the first memristive circuit device. A charging current for the capacitance associated with the control electrode of the first transistor can thereby be limited by the memristive element, for example in the sense of the first input variable.

In further exemplary embodiments of the present invention, it is provided that the method comprises: providing a charging current for charging the capacitance associated with the control electrode of the first transistor, for example by means of a charging device.

In further exemplary embodiments of the present invention, it is provided that the method comprises: providing an input voltage based on the second input variable; applying the input voltage to the control electrode of the first transistor via the first memristive circuit device; and, optionally, at least periodically charging the capacitance associated with the control electrode of the first transistor. In further exemplary embodiments, by charging via the first memristive circuit device, e.g. a time behavior for charging the capacitance (and thus for example for putting the load path of the transistor into a low-impedance state) can be set. In addition, the time behavior for charging depends on the input voltage, which, for example its time curve, can be selected for example on the basis of the second input variable.

In further exemplary embodiments of the present invention, it is provided that the method comprises: ascertaining a first point in time at which the current through the load path of the first transistor exceeds a prespecifiable first threshold value (for example, considered from the charging of the capacitance associated with the control electrode of the first transistor); ascertaining the first output variable on the basis of the first point in time.

In other words, using the principle according to the embodiments, for example, a multiplication a*b=c (* is the ("scalar") multiplication operator) can be evaluated using the first transistor, wherein the factor a corresponds to for example the first input variable (for example, the programmed resistance value of a component of the first memristive circuit element, e.g. programmed conductivity of a memristive element of the first memristive circuit device) and wherein the factor b corresponds to for example the second input variable (for example, the input voltage, or the time curve of the input voltage for charging the capacitance associated with the control electrode of the first transistor).

In further exemplary embodiments of the present invention, it is provided that the prespecifiable first threshold value corresponds to at least one of the following elements: a) saturation current of the first transistor; b) limit current to which the current through the load path of the first transistor can be limited and/or is limited, for example by means of at least one limiting resistor connected in series with the load path; c) any prespecifiable current value.

In further exemplary embodiments of the present invention, it is provided that the first control signal at least periodically comprises at least one of the following time curves: a) stepped shape, for example a rising stepped shape, wherein for example the stepped shape can be characterized by at least one of the following elements: a1) step width; a2) step height; a3) time offset, for example with respect to a reference time; b) increasing, for example increasing monotonically.

In further exemplary embodiments of the present invention, the first control signal may also have a non-constant, e.g. time-varying, step width and/or step height. In other words, in further exemplary embodiments, a time curve can be used at least periodically for the first control signal, which curve, for example instead of a stepped shape, has a linear course, for example increasing monotonically at least on average over time.

In further exemplary embodiments of the present invention, it is provided that the processing device has at least one further transistor, for example a field-effect transistor, wherein a corresponding first terminal of a load path of the first transistor and of the at least one further transistor is connected to a first circuit node, wherein the method comprises: providing the at least one further transistor and a corresponding further memristive circuit device which characterizes a first input variable associated with the at least one further transistor, wherein a charging current of a capacitance associated with a control electrode of the at least one further transistor can be influenced by means of the corresponding further memristive circuit device; applying to a corresponding control electrode of the at least one further transistor a corresponding first control signal which characterizes a second input variable associated with the corresponding further transistor; ascertaining the first output variable on the basis of a second variable characterizing a time curve of a current associated with the first circuit node, wherein for example the second variable is at least one of the following elements: a) the current itself associated with the first circuit node; b) a voltage that can be ascertained on the basis of at least the current associated with the first circuit node.

In further exemplary embodiments of the present invention, it is provided that the method comprises: specifying, for example using, a first step width for the stepped shape of the first control signal for the first transistor; specifying, for example using, a second step width for the stepped shape of the first control signal for the second transistor; and, optionally, specifying, for example using, a third step width for the stepped shape of the first control signal for the third transistor, wherein for example specifying the first step width comprises specifying the first step width based on the second input variable associated with the first transistor, wherein for example specifying the second step width comprises specifying the second step width based on the second input variable associated with the second transistor, wherein for example specifying the third step width comprises specifying the third step width based on the second input variable associated with the third transistor. Obviously, in further exemplary embodiments, at least some of the step widths can at least periodically be the same or different from each other, for example depending on the relevant second input variables.

In further exemplary embodiments of the present invention, it is provided that the method comprises at least one of the following elements: a) specifying, for example using, a first time offset, for example with respect to a reference time (for example, starting time for a measurement), for applying the first control signal to the control electrode of the first transistor, wherein for example the specifying of the first time offset comprises a specifying of the first time offset on the basis of the second input variable associated with the first transistor; b) specifying, for example using, a second time offset, for example with respect to the reference time, for applying the first control signal to the control electrode of the second transistor, wherein for example the specifying of the second time offset comprises a specifying of the second time offset on the basis of the second input variable associated with the second transistor; c) specifying, for example using, a third time offset, for example with respect to the reference time, for applying the first control signal to the control electrode of the third transistor, wherein for example the specifying of the third time offset comprises a specifying of the third time offset on the basis of the second input variable associated with the third transistor. Obviously, in further exemplary embodiments, at least some of the time offsets can at least periodically be the same or different from each other, for example depending on the relevant second input variables.

In further exemplary embodiments of the present invention, it is provided that the method comprises: specifying, for example using, a first, for example constant, amplitude value for the first control signal when the second input variable, for example associated with a corresponding first and/or second and/or third transistor (and/or further transistor), has a value smaller than a specifiable minimum value, for example a value of zero, wherein the first amplitude value is smaller, for example by a specifiable amount, than a threshold voltage, for example a smallest possible threshold voltage, of at least one of the transistors. In further exemplary embodiments, a leakage current can thereby be reduced, for example in cases in which the second input variable has the value zero. In further exemplary embodiments, the first amplitude value can e.g. at least periodically also be negative.

In further exemplary embodiments of the present invention, as already described above, a non-vanishing, e.g. positive, e.g. stepped or monotonically or at least on average monotonically increasing curve is used for the first control signal, e.g. if the second input variable, e.g. associated with a relevant first and/or second and/or third transistor (and/or further transistor), has a value greater than zero. For example, an amplitude of a stepped first control signal increases at particular time intervals, so that (e.g. also depending on the state of the memristive circuit device) a transistor driven thereby becomes active after a certain time, i.e., its load path becomes low-ohmic, e.g. until the end of a measurement. This causes a current to flow through the load path of the transistor, which leads for example to the charging/discharging of a capacitor of which the voltage can be evaluated.

In further exemplary embodiments of the present invention, it is provided that the method comprises at least one of the following elements: a) specifying, for example using, a first slope for the increasing time curve of the first control signal for the first transistor; b) specifying, for example using, a second slope for the increasing time curve of the first control signal for the second transistor; c) specifying, for example using, a third slope for the increasing time curve of the first control signal for the third transistor, wherein for example the specifying of the first slope comprises a specifying of the first slope based on the second input variable associated with the first transistor, wherein for example the specifying of the second slope comprises a specifying of the second slope based on the second input variable associated with the second transistor, wherein for example the specifying of the third slope comprises a specifying of the third slope based on the second input variable associated with the third transistor. Obviously, in further exemplary embodiments, at least some of the slopes can at least periodically be the same or different from each other, for example depending on the relevant second input variables.

In further exemplary embodiments of the present invention, it is provided that at least the first transistor, for example a plurality of transistors, has or have a corresponding current-limiting function for limiting a current through its drain-to-source path, wherein for example the current-limiting function is implemented by means of at least one of the following elements: a) a setting of a voltage for the control electrode of the corresponding transistor, for example such that a maximum prespecifiable current through the drain-to-source path is not exceeded; b) a current-limiting element, for example a resistor or a transistor configured as a resistor, for example a field-effect transistor, in series with the load path.

In further exemplary embodiments of the present invention, it is provided that the method comprises at least one of the following elements: a) at least periodically limiting a first current through the load path of the first transistor, for example by means of a first current-limiting element, for example comprising a resistor or a transistor configured as a resistor, for example a field-effect transistor, wherein for example the limiting of the first current through the load path of the first transistor comprises limiting the first current based on the second input variable associated with the first transistor; b) at least periodically limiting a second current through the load path of the second transistor, for example by means of a second current-limiting element, for example comprising a resistor or a transistor configured as a resistor, for example a field-effect transistor, wherein for example the limiting of the second current through the load path of the second transistor comprises limiting the second current based on the second input variable associated with the second transistor.

In further exemplary embodiments of the present invention, it is provided that the method comprises at least one of the following elements: specifying, for example using, a first logarithmic step width which changes logarithmically over time, for example increases, for the stepped shape of the first control signal for the first transistor; b) specifying, for example using, a second logarithmic step width which changes logarithmically over time, for example increases, for the stepped shape of the first control signal for the second transistor; c) specifying, for example using, a third logarithmic step width which changes logarithmically over time, for example increases, for the stepped shape of the first control signal for the third transistor, wherein for example the specifying of the first logarithmic step width is done based on the second input variable associated with the first transistor, wherein for example the specifying of the second logarithmic step width is done based on the second input variable associated with the second transistor, wherein for example the specifying of the third logarithmic step width is done based on the second input variable associated with the third transistor.

In further exemplary embodiments of the present invention, for example a step height can also be changed, and for example a step width can be retained for the first control signal.

In further exemplary embodiments of the present invention, for example a step height can also be changed, and for example the step width can also be changed for the first control signal.

In further exemplary embodiments of the present invention, it is provided that the processing device comprises a plurality of transistors, wherein at least some aspects according to the embodiments are applied to at least some transistors of the plurality of transistors.

In further exemplary embodiments of the present invention, it is provided that the method comprises: starting at least one of the following elements at a reference time: a) applying the first control signal to the control electrode of the first transistor; b) applying a, or the, corresponding first control signal to a corresponding control electrode of at least one further transistor, or of the at least one further transistor; ascertaining the output variable after a specifiable time period.

In further exemplary embodiments of the present invention, it is provided that the first memristive circuit device has a voltage divider with at least a first memristive element, wherein the application to the control electrode of the first transistor and/or a control electrode of at least one further transistor is done by means of the voltage divider.

For example, in further exemplary embodiments of the present invention, the voltage divider may have a series circuit of the first memristive element and a resistive element, e.g. an ohmic resistor.

For example, in further exemplary embodiments of the present invention, the voltage divider may have a series circuit of the first memristive element and a second memristive element.

By specifying a resistance ratio of the components of the voltage divider, in further exemplary embodiments for example a transfer function of the first memristive circuit device can be specified for the first control signal, and thus for example a switching behavior of the transistor in question can be influenced, whereby in further exemplary embodiments for example a change in a threshold voltage (which is e.g. fixed in itself) of the transistor in question can be emulated.

Further exemplary embodiments of the present invention relate to a device for carrying out the method according to the embodiments.

In further exemplary embodiments of the present invention, it is provided that the device comprises a processing device having at least a first transistor, for example a field-effect transistor, with a first memristive circuit means, wherein the first memristive circuit means characterizes a first input variable associated with the first transistor, wherein for example the processing device comprises a number n, where n>1, of transistors, for example field-effect transistors.

In further exemplary embodiments of the present invention, it is provided that the device comprises a plurality of transistors and a plurality of memristive circuit devices, wherein for example each one of the plurality of memristive circuit devices is associated with a corresponding one of the plurality of transistors.

In further exemplary embodiments of the present invention, it is provided that at least the first memristive circuit device has at least one memristive element, wherein for example in the case of a plurality of memristive circuit devices, each of the plurality of memristive circuit devices has at least one memristive element.

In further exemplary embodiments of the present invention, it is provided that the at least one memristive element has one of the following types, for example is formed as one of the following types: a) memristor; b) resistive random access memory, for example RRAM, for example resistive random access memory; c) phase change memory, for example PCM; d) metal oxide resistive memory, for example OxRAM, e) further, for example two-pole, memristive element, for example memory element.

In further exemplary embodiments of the present invention, an electrical resistance of the at least one memristive element is specifiable, for example by programming, whereby a value for the first input variable can be assigned to the at least one memristive element, which value, as already described above, acts on the charging current of the capacitance associated with the control electrode. For example, according to the value of the first input variable, the at least one memristive element can limit the charging current, for example for a Miller capacitance of the first transistor, and thus realize for example a time behavior dependent on the Miller capacitance and on the value of the first input variable for activating (switching from a non-conductive state into a conductive state) the first transistor.

In further exemplary embodiments of the present invention, it is provided that the device has at least one analog/digital converter, for example a current-based analog/digital converter and/or a voltage-based analog/digital converter.

In further exemplary embodiments of the present invention, it is provided that the device has at least one capacitor which can be charged at least periodically by means of at least one current through at least one load path of at least one transistor. In further exemplary embodiments, the capacitor accumulates, for example integrates, the e.g. temporally changing current contributions of the individual transistors, e.g. such that the output variable can be ascertained e.g. based on the voltage of the capacitor (e.g. observed at an end of a measurement period).

In further exemplary embodiments of the present invention, it is provided that the device has a discharge device for at least periodically discharging the capacitor, whereby, for example, a "result" of a preceding calculation can be reset by means of the processing device, so that, for example, a further calculation can be carried out. For example, the discharge device can have at least one discharge transistor or switch.

In further exemplary embodiments of the present invention, it is provided that the device has a programming device for programming at least one component of the first memristive circuit device and/or at least one component of at least one further memristive circuit device that may be present.

In the case of the optional provision of at least one transistor of the FeFET type, in further exemplary embodiments it can be provided that the programming device is (e.g. also) designed for programming the FeFET.

In further exemplary embodiments of the present invention, it is provided that the device comprises at least one of the following elements: a) a first current-limiting element, for example comprising a resistor or a transistor configured as a resistor, for example a field-effect transistor, for at least periodically limiting a first current through the load path of the first transistor; b) a second current-limiting element, for example comprising a resistor or a transistor configured as a resistor, for example a field-effect transistor, for at least periodically limiting a second current through the load path of the second transistor.

In further exemplary embodiments of the present invention, it is provided that a) the first current-limiting element is designed to limit the first current non-constantly over time, for example variably, for example on the basis of the first input variable associated with the second transistor, and/or that b) the second current-limiting element is designed to limit the second current non-constantly over time, for example variably, for example on the basis of the second input variable associated with the second transistor.

In further exemplary embodiments of the present invention, it is provided that the device has at least one control device which is designed to provide, at least periodically, at least one of the following elements: a) the first control signal for the first transistor; b) the first control signal for the second transistor; c) the first control signal for the third transistor.

In further exemplary embodiments of the present invention, it is provided that the device has a control device which is designed to execute at least one of the following elements: a) control of at least one component of the device; b) execution of at least one aspect of the method according to the embodiments.

Further exemplary embodiments of the present invention relate to a computing device, for example a vector-matrix multiplication device, comprising at least one device according to the embodiments.

Further exemplary embodiments of the present invention relate to a use of the method according to the embodiments and/or of the device according to the embodiments and/or of the computing device according to the embodiments for at least one of the following elements: a) execution of compute-in-memory methods, for example with weights and/or input variables which can in each case have one or a plurality of bits; b) artificial neural networks, for example artificial deep neural networks; c) image processing; d) efficient execution of calculations; e) increasing an efficiency for the execution of calculations; f) automated driving; g) machine learning, for example inference.

Further features, possible applications and advantages of the present invention will be apparent from the following description of exemplary embodiments of the present invention shown in the figures. In this case, all of the features described or shown form the subject matter of the present invention individually or in any combination, irrespective of their wording or representation in the description or in the figures.

BRIEF DESCRIPTION OF THE DRAWINGS

FIG. 29A schematically shows control signals according to exemplary embodiments of the present invention.

FIG. 29B schematically shows control signals according to exemplary embodiments of the present invention.

FIG. 29C schematically shows control signals according to exemplary embodiments of the present invention.

FIG. 31A schematically shows time curves of variables associated with the circuit diagram according to FIG. 27 according to exemplary embodiments of the present invention.

FIG. 31B schematically shows a time curve of a variable associated with the circuit diagram according to FIG. 27 according to exemplary embodiments of the present invention.

FIG. 31C schematically shows time curves of variables associated with the circuit diagram according to FIG. 27 according to exemplary embodiments of the present invention.

FIG. 31D schematically shows a time curve of a variable associated with the circuit diagram according to FIG. 27 according to further exemplary embodiments of the present invention.

DETAILED DESCRIPTION OF EXAMPLE EMBODIMENTS

Figure 1:
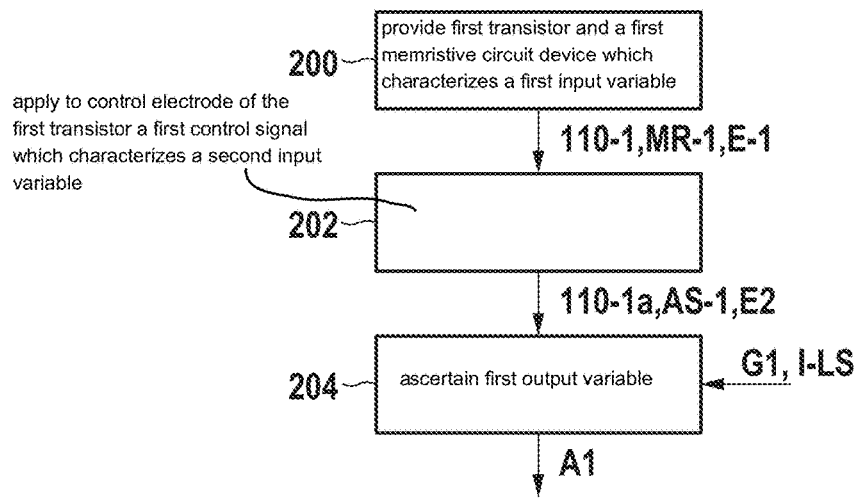
FIG. 1 schematically shows a simplified flowchart according to exemplary embodiments of the present invention.
Figure 2:
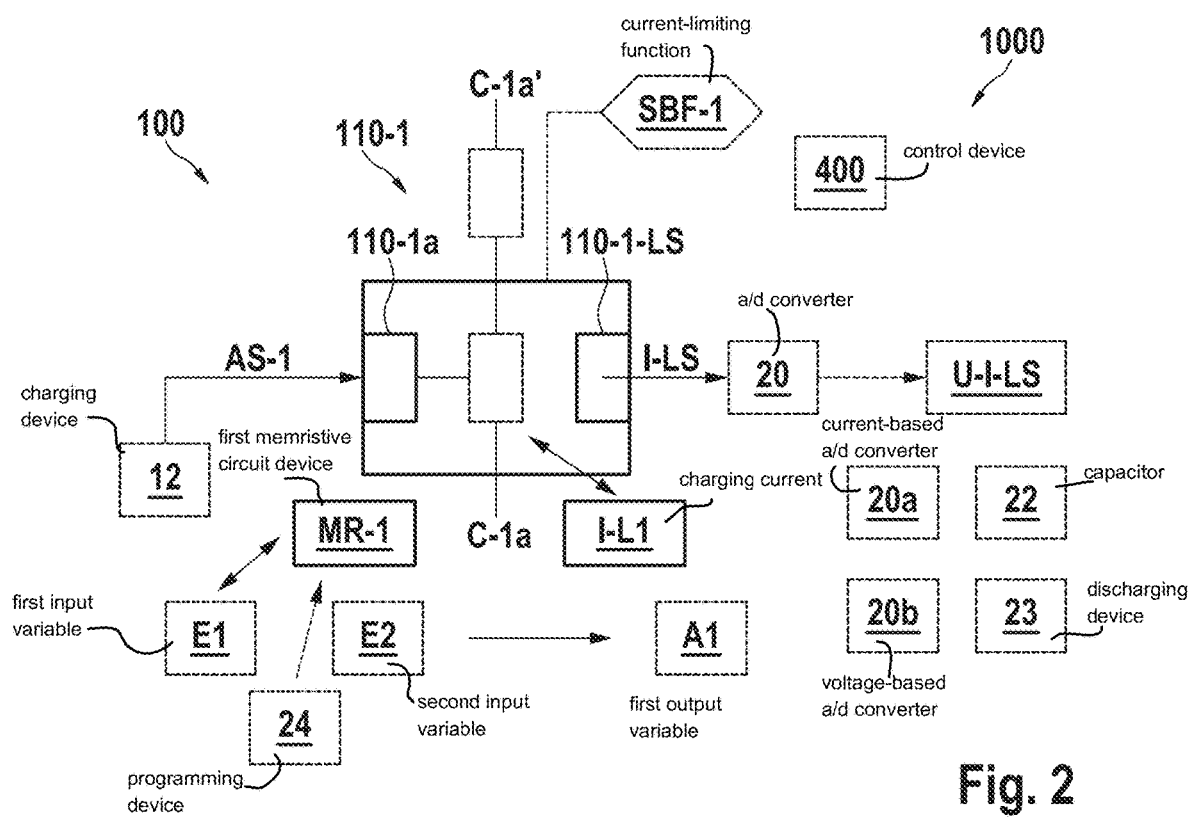
FIG. 2 schematically shows a simplified block diagram according to exemplary embodiments of the present invention.

Exemplary embodiments, see e.g. FIGS. 1 and 2, relate to a method for processing input variables by means of a processing device 100 having at least a first transistor 110-1, for example a field-effect transistor, comprising: providing 200 (FIG. 1) the first transistor 110-1 and a first memristive circuit device MR-1 which characterizes a first input variable E1 associated with the first transistor 110-1, wherein a charging current I-L1 of a capacitance C-1a associated with, for example connected to, a control electrode 110-1a (FIG. 2) of the first transistor 110-1 can be influenced by means of the first memristive circuit device MR-1; applying 202 (FIG. 1) to the control electrode 110-1a of the first transistor 110-1 a first control signal AS-1 which characterizes a second input variable E2; 110-1-E2 associated with the first transistor 110-1 and which has at least periodically a non-constant amplitude; ascertaining 204 a first output variable A1 on the basis of a first variable G1 characterizing a time curve of a current I-LS through a load path 110-1-LS of the first transistor 110-1.

In further exemplary embodiments, for example in this way a calculation based on the first input variable E1 and the second input variable E2 can be carried out using the transistor 110-1, i.e., for example in a hardware-based manner.

In further exemplary embodiments, the first input variable E1 can for example characterize or represent a digital (e.g. discrete-value) input value, which can be realized for example by a state of the first memristive circuit device MR-1, e.g. by corresponding programming of at least one memristive element of the first memristive element (see FIG. 28A, element MRE-1) of the first memristive circuit device MR-1.

In further exemplary embodiments, the second input variable E2 can for example characterize or represent a digital (e.g. discrete-value) input value.

In further exemplary embodiments, FIG. 2, the first transistor 110-1 can be activated e.g. for a specifiable time (i.e., its load path 110-1-LS can be set to a low-impedance state, for example) based on the first control signal AS-1 or the second input variable E2, wherein the specifiable time is for example proportional to the first control signal AS-1. The same can also apply for example to the multiple transistors in other exemplary embodiments with multiple transistors; see e.g. FIG. 12.

In further exemplary embodiments, FIG. 2, the first transistor 110-1 has a for example fixed threshold voltage, wherein an activation of the first transistor 110-1 can be influenced for example by the first memristive circuit device MR-1, for example by a voltage divider device ST (FIG. 24) with at least one memristive element. As a result, in further exemplary embodiments e.g. the first transistor 110-1 may appear to have a different threshold voltage than its e.g. fixed threshold voltage, for example based on a state of the first memristive circuit device MR-1. The same may also apply for example to the multiple transistors in other exemplary embodiments with multiple transistors 110-1, 110-2, 110-3 (see e.g. FIG. 12).

In further exemplary embodiments (not shown), at least one transistor with a variable, for example programmable, threshold voltage can also be used, such as a ferroelectric field-effect transistor, FeFET. For the following description of exemplary embodiments, however, without limitation of generality, at least one transistor 110-1 with a fixed threshold voltage is assumed (and not for example FeFET(s)).

In further exemplary embodiments, FIG. 1, 2, it is provided that the first variable G1 is at least one of the following elements: a) the current I-LS through the load path 110-1-LS itself; b) a voltage that can be ascertained based at least on the current I-LS through the load path 110-1-LS, such as can be obtained for example by charging or recharging a capacitance 22, for example by means of the current I-LS through the load path 110-1-LS.

Figure 3:
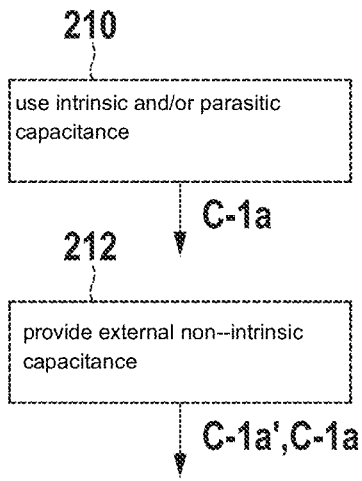
FIG. 3 schematically shows a simplified flowchart according to exemplary embodiments of the present invention.

In further exemplary embodiments, FIG. 3, it is provided that the method comprises at least one of the following elements: a) using 210 an intrinsic and/or parasitic capacitance C-1a, for example a Miller capacitance of the first transistor 110-1 as the capacitance associated with the control electrode 110-1a of the first transistor 110-1; b) providing 212 an external, for example non-intrinsic, capacitance C-1a', for example in addition to a or the intrinsic capacitance C-1a, for the capacitance associated with the control electrode 110-1a of the first transistor 110-1.

As an alternative or in addition to the intrinsic Miller capacitance C-1a, for example in further exemplary embodiments of the control electrode 110-1a a further capacitance C-1a' can thus be assigned, for example for setting a prespecifiable capacitance value. In further exemplary embodiments, it is also possible to adjust the intrinsic capacitance C-1a within the framework of manufacturing conditions during a manufacturing process. In further exemplary embodiments, the charging of the above-described capacitance C-1a makes possible a defined activation of the transistor 110-1, i.e., for example a shifting of the transistor 110-1 from a for example blocking (high-impedance) state into a conductive (low-impedance) state.

Figure 4:
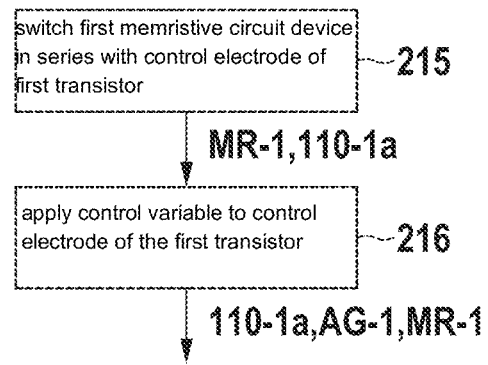
FIG. 4 schematically shows a simplified flowchart according to exemplary embodiments of the present invention.
Figure 5:
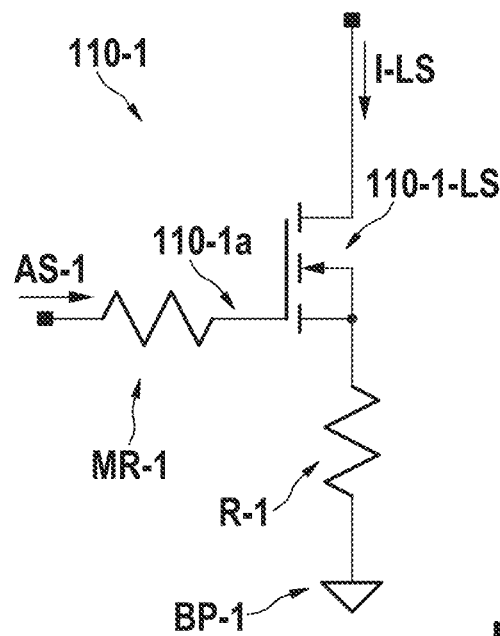
FIG. 5 schematically shows a simplified circuit diagram according to exemplary embodiments of the present invention.

In further exemplary embodiments, FIG. 4, it is provided that the method comprises: switching 215 the first memristive circuit device MR-1 in series with the control electrode 110-1a of the first transistor 110-1, see FIG. 5; applying 216 (FIG. 4) the first control variable AS-1 to the control electrode 110-1a of the first transistor 110-1 via the first memristive circuit device MR-1. A charging current for the capacitance associated with the control electrode 110-1a of the first transistor 110-1 can thereby be limited by the memristive element, for example in the sense of the first input variable E1.

In further exemplary embodiments, FIG. 5, a current limitation of the current I-LS through the load path 110-1-LS of the first transistor is provided, for example by means of a resistor R-1 in series with the load path 110-1-LS. In the present example, the resistor R-1 is connected between the load path 110-1-LS and a first reference potential BP-1, for example a ground potential.

Figure 6:
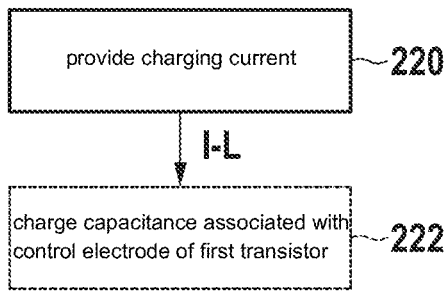
FIG. 6 schematically shows a simplified flowchart according to exemplary embodiments of the present invention.
Figure 8:
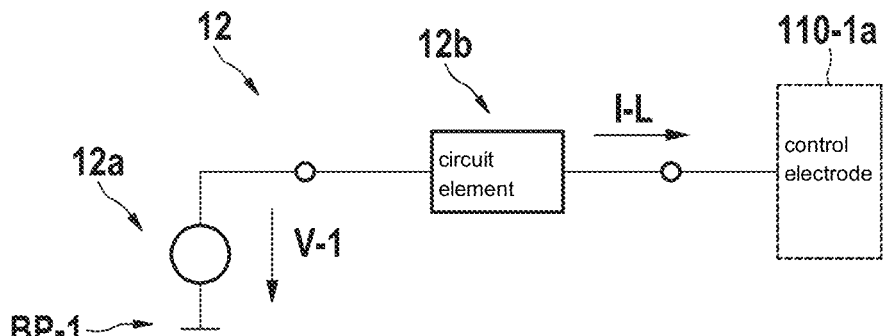
FIG. 8 schematically shows a simplified circuit diagram according to further exemplary embodiments of the present invention.

In further exemplary embodiments, FIG. 6, it is provided that the method comprises: providing 220 a charging current I-L for charging 222 the capacitance associated with the control electrode 110-1a of the first transistor 110-1, for example by means of a charging device. FIG. 8 shows an example of a charging device 12 comprising a voltage source 12a, which provides a voltage V-1, and a further circuit element 12b, e.g.

a resistor. By way of example, in further embodiments the resistor 12b may be realized by the first memristive circuit device MR-1 or at least one component of the first memristive circuit device MR-1. For example, the voltage source V-1 can provide an electrical voltage in accordance with the first control signal AS-1 or the second input variable E2.

Figure 7:
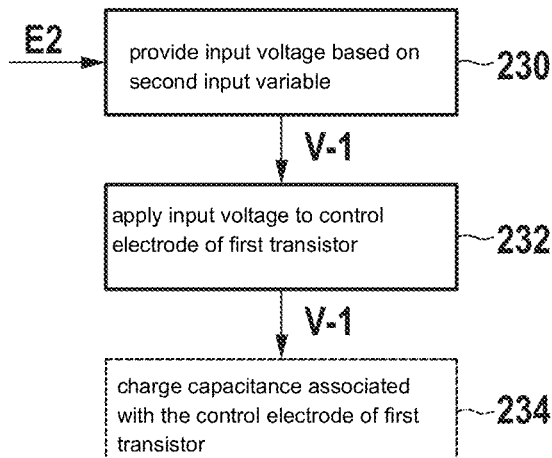
FIG. 7 schematically shows a simplified flowchart according to exemplary embodiments of the present invention.

In further exemplary embodiments, FIG. 7, it is provided that the method comprises: providing 230 an input voltage V-1 based on the second input variable E2; applying 232 the input voltage V-1 to the control electrode 110-1a of the first transistor 110-1 via the first memristive circuit device MR-1; and, optionally, at least periodically charging 234 the capacitance associated with the control electrode of the first transistor 110-1. In further exemplary embodiments, by charging 234 via the first memristive circuit device MR-1, e.g. a time behavior for charging the capacitance C-1a (and thus for example for putting the load path of the transistor 110-1 into a low-impedance state) can be set. In addition, the time behavior for charging 234 depends on the input voltage V-1, which, for example its time curve, can be selected for example on the basis of the second input variable E2.

Figure 9:
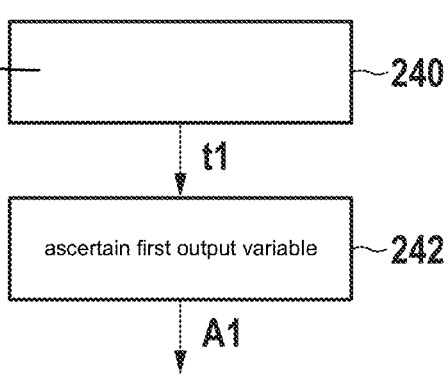
FIG. 9 schematically shows a simplified flowchart according to further exemplary embodiments of the present invention.

In further exemplary embodiments, FIG. 9, it is provided that the method comprises: ascertaining 240 a first point in time t1 at which the current I-LS (FIG. 2) through the load path 110-1-LS of the first transistor 110-1 exceeds a pre-specifiable first threshold value (for example, considered starting from the charging 234 of the capacitance associated with the control electrode 110-1a of the first transistor 110-1); ascertaining 242 the first output variable A1 on the basis of the first time t1.

In other words, using the principle according to the embodiments, for example a multiplication a*b=c (* is the ("scalar") multiplication operator) can be evaluated using the first transistor, wherein the factor a corresponds to for example the first input variable R1 (for example, the programmed resistance value of a component MRE-1 of the first memristive circuit device MR-1, e.g. programmed conductivity of a memristive element of the first memristive circuit device) and wherein the factor b corresponds to for example the second input variable E2 (for example, the input voltage V-1, or the time curve of the input voltage V-1 for charging 234 the capacitance associated with the control electrode 110-1a of the first transistor 110-1).

In further exemplary embodiments, it is provided that the specifiable first threshold value corresponds to at least one of the following elements: a) saturation current of the first transistor 110-1; b) limit current to which the current I-LS through the load path of the first transistor 110-1 can be limited and/or is limited, for example by means of at least one limiting resistor R-1 (FIG. 5) connected in series with the load path; c) any prespecifiable current value.

Figure 10:
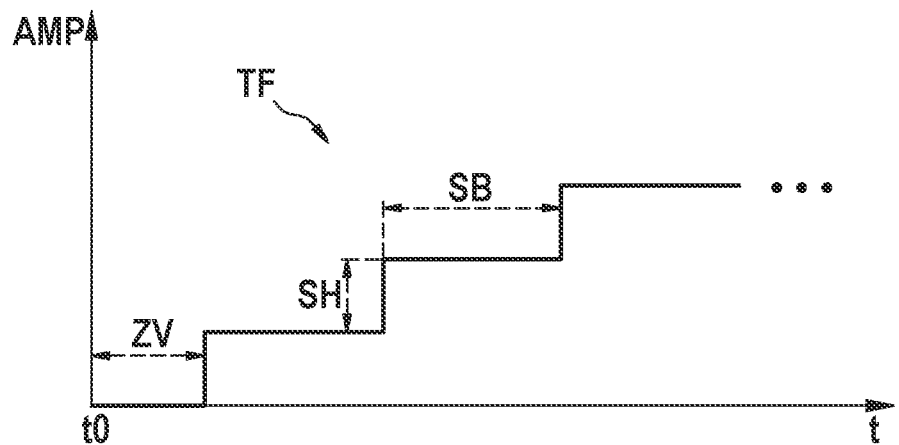
FIG. 10 schematically shows a time curve of an amplitude according to further exemplary embodiments of the present invention.
Figure 11:
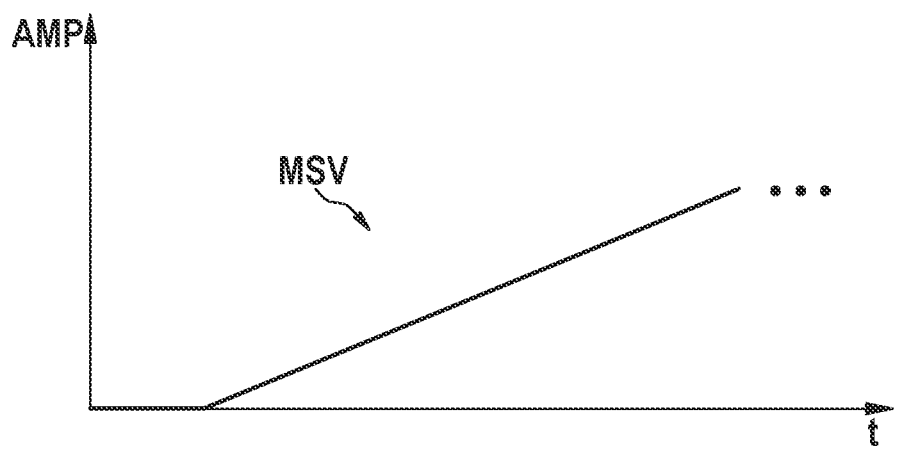
FIG. 11 schematically shows a time curve of an amplitude according to further exemplary embodiments of the present invention.

In further exemplary embodiments, FIG. 10, it is provided that the first control signal AS-1 (FIG. 1, 2) has at least one of the following time curves, at least periodically, see amplitude AMP plotted over the time axis t: a) stepped shape TF (FIG. 10), for example a rising stepped shape, wherein for example the stepped shape TF can be characterized by at least one of the following elements: a1) step width SB; a2) step height SH; a3) time offset ZV, for example with respect to a reference time b); b) increasing, for example increasing monotonically; see the monotonically increasing time curve MSV of the amplitude AMP according to FIG. 11.

In further exemplary embodiments, FIG. 10, the first control signal AS-1 can also have a non-constant, e.g. time-varying, step width SB and/or step height SH.

In further exemplary embodiments, FIG. 11, a time curve AMP can be used for the first control signal AS-1, at least periodically, which for example has, instead of a stepped shape TF (FIG. 10), a linear curve (FIG. 11), for example monotonically increasing at least averaged over time.

Figure 12:
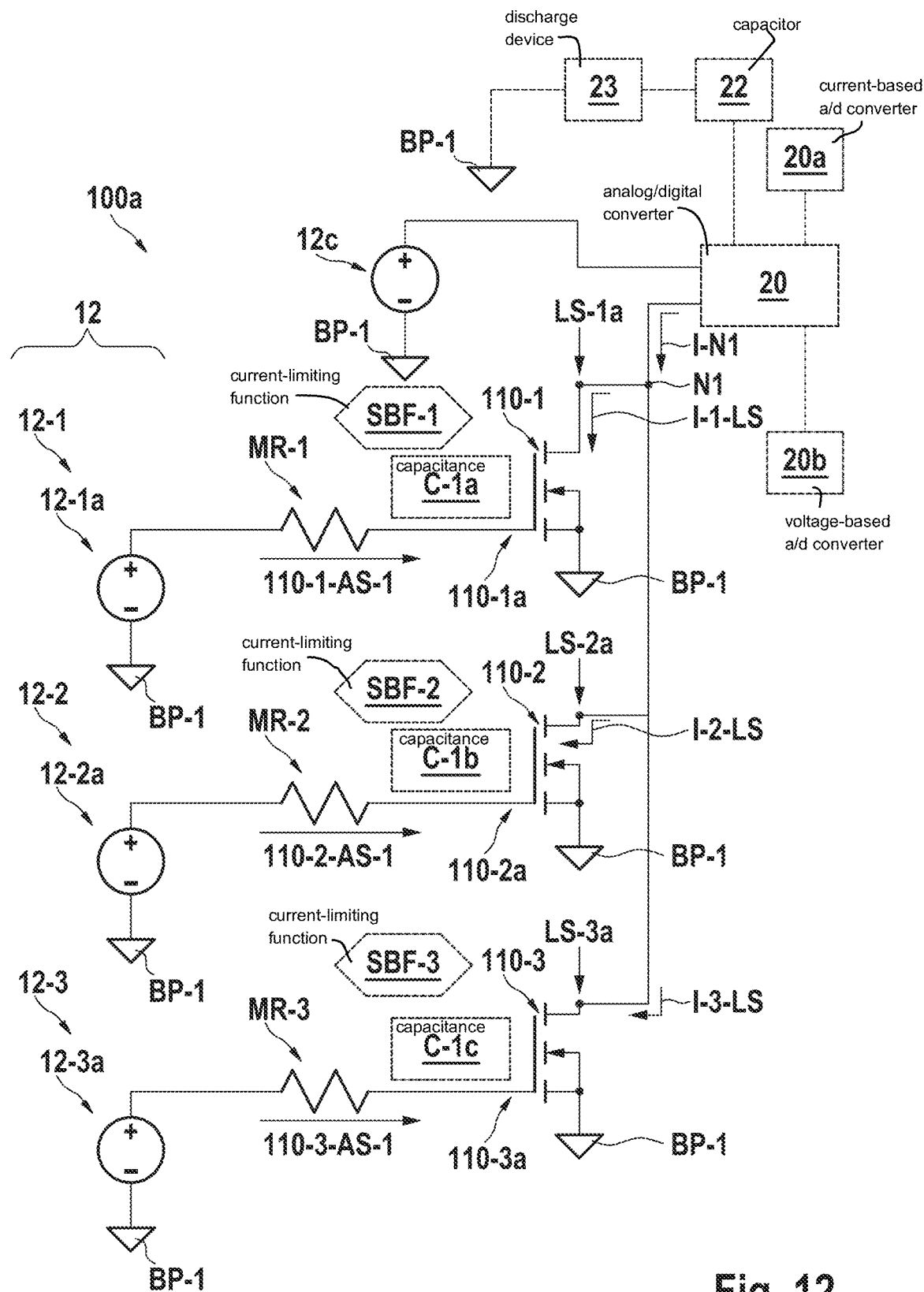
FIG. 12 schematically shows a simplified circuit diagram according to exemplary embodiments of the present invention.
Figure 13:
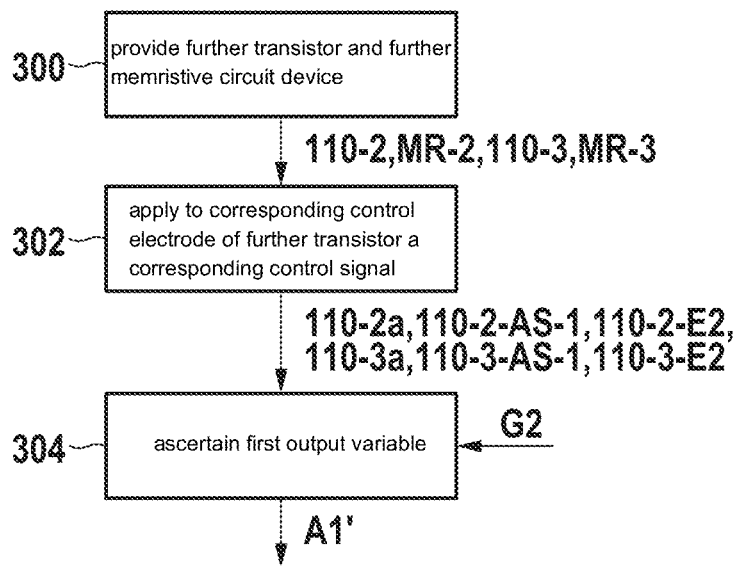
FIG. 13 schematically shows a simplified flowchart according to exemplary embodiments of the present invention.

In further exemplary embodiments, FIG. 12, it is provided that the processing device 100a has, e.g. in addition to the first transistor 110-1, at least one further transistor 110-2, 110-3, for example a field-effect transistor, wherein a corresponding first terminal LS-1a, LS-2a, Ls-3a of a load path of the first transistor 110-1 and of the at least one further transistor 110-2, 110-3 is connected to a first circuit node N1, wherein the method comprises: providing 300 (FIG. 13) the at least one further transistor 110-2, 110-3 and a corresponding further memristive circuit device MR-2, MR-3 which characterizes a first input variable associated with the at least one further transistor, wherein a charging current of a capacitance C-1b, C-1c associated with a control electrode 110-2a, 110-3a of the at least one further transistor 110-2, 110-3 can be influenced by means of the corresponding further memristive circuit device MR-2, MR-3 (e.g. in a manner similar or identical to that described as an example above for the first memristive circuit device MR-1); applying 302 to a corresponding control electrode 110-2a, 110-3a of the at least one further transistor 110-2, 110-3 a corresponding first control signal 110-2-AS-1, 110-3-AS-1 which characterizes a second input variable 110-2-E2, 110-3-E2 associated with the corresponding further transistor 110-2, 110-3; ascertaining 304 the first output variable A1' on the basis of a second variable G2 characterizing a time curve of a current I-N1 associated with the first circuit node N1, wherein for example the second variable G2 is at least one of the following elements: a) the current I-N1 itself associated with the first circuit node N1; b) a voltage that can be ascertained on the basis of at least the current I-N1 associated with the first circuit node N1.

The application 302 can also include the application 202 according to FIG. 1, i.e., the application to the control electrode 110-1a of the first transistor 110-1.

In further exemplary embodiments, FIG. 12, a calculation of the MAC (multiply and accumulate) type is for example hereby made possible, wherein the first transistor 110-1 and the at least one further, for example second, transistor 110-2 in each case perform a multiplication, for example analogous to the embodiments described above by way of example. An accumulation, for example addition, takes place here for example by the respective load paths of the transistors 110-1, 110-2 being connected to the first circuit node N1, namely for example by an addition of the currents I-1-LS, I-2-LS of the transistors 110-1, 110-2. The same also applies to any further transistors 110-3 that may be present and their current I-3-LS.

For example, in the above-mentioned configuration 100a a first product c1=a1*b1 can be ascertained by the first transistor 110-1 on the basis of the factors a1, b1 (realizable for example by programming a corresponding resistance value for the first memristive circuit device MR-1 and/or specifying a corresponding input voltage for charging for example the intrinsic capacitance of the first transistor 110-1), and a second product c2=a2*b2 can be ascertained by the second transistor 110-2 on the basis of the factors a2, b2 (realizable for example by programming a corresponding resistance value for the second memristive circuit device MR-2 and/or specifying a corresponding input voltage for charging for example the intrinsic capacitance of the second transistor 110-3), wherein an accumulation, for example addition, c1+c2 can be carried out by the combination of the corresponding load currents through the load paths of the two transistors in the first circuit node N1. Even in exemplary embodiments with more than one transistor 110-1, the result c1+c2 of the MAC calculation can also be deduced on the basis of the second variable G2 and, optionally, a possibly effected assignment of points in time at which one or more corresponding threshold values are exceeded by the second variable G2.

The elements 12-1a, 12-2a, 12-3a according to FIG. 12 symbolize voltage sources of corresponding charging devices 12-1, 12-2, 12-3, which characterize the corresponding second input variable E2, 110-2-E2, 110-3-E2, thus providing for example a corresponding first control signal 110-1-AS-1, 110-2-AS-1, 110-3-AS-1—via the corresponding memristive switching device MR-1, MR-2, MR-3—for the corresponding control electrode 110-1a, 110-2a, 110-3a.

The element 12c according to FIG. 12 symbolizes an optional operating voltage supply.

In further exemplary embodiments, FIG. 12, it is provided that the processing device 100a has a number n, where n>1 (in the present example e.g. n=3), of transistors 110-1, 110-2, 110-3, . . . with in each case an associated memristive switching device MR-1, MR-2, MR-3, . . . , wherein a corresponding first terminal LS-1a, LS-2a, LS-3a, . . . of a load path of the n transistors 110-1, 110-2, 110-3, . . . is connected to a, for example the, first circuit node N1. In further exemplary embodiments, the principle according to the embodiments can thus be extended to any number n of transistors, so that, for example, MAC calculations are possible which makes possible a formation of, for example maximally, n many products and an accumulation of the, for example maximally, n many products. In further exemplary embodiments, such calculations can be used, for example, for the evaluation (inference) of artificial (deep) neural networks ((D)NN).

Figure 14:
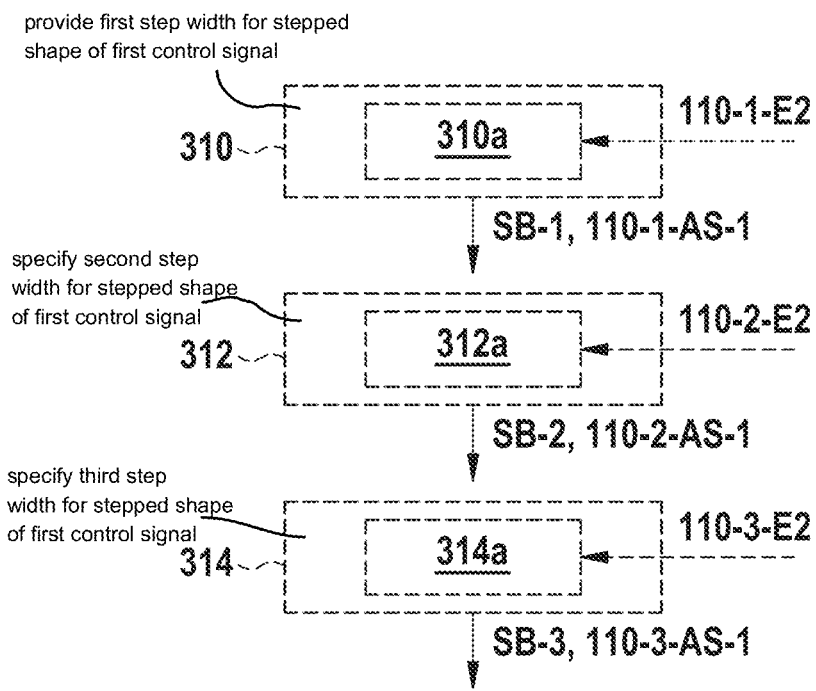
FIG. 14 schematically shows a simplified flowchart according to exemplary embodiments of the present invention.

In further exemplary embodiments, FIG. 14, it is provided that the method comprises: providing 310, for example using, a first step width SB-1 for the stepped shape of the first control signal 110-1-AS-1 for the first transistor 110-1 (FIG. 12), specifying 312, for example using, a second step width SB-2 for the stepped shape of the first control signal 110-2-AS-1 for the second transistor 110-2, and, optionally, specifying 314, for example using, a third step width SB-3 for the stepped shape of the first control signal 110-3-AS-1 for the third transistor 110-3, wherein for example the specifying 310 of the first step width SB-1 comprises a specifying 310a of the first step width based on the second input variable 110-1-E2 associated with the first transistor, wherein for example the specifying 312 of the second step width SB-2 comprises a specifying 312a of the second step width SB-2 based on the second input variable 110-2-E2 associated with the second transistor, wherein for example the specifying 314 of the third step width SB-3 comprises a specifying 314a of the third step width based on the second input variable 110-3-E2 associated with the third transistor. Obviously, in further exemplary embodiments, at least some of the step widths SB-1, SB-2, SB-3 can at least periodically be the same or different from each other, e.g. depending on the respective second input variables 110-1-E2, 110-2-E2, 110-3-E2.

Figure 15:
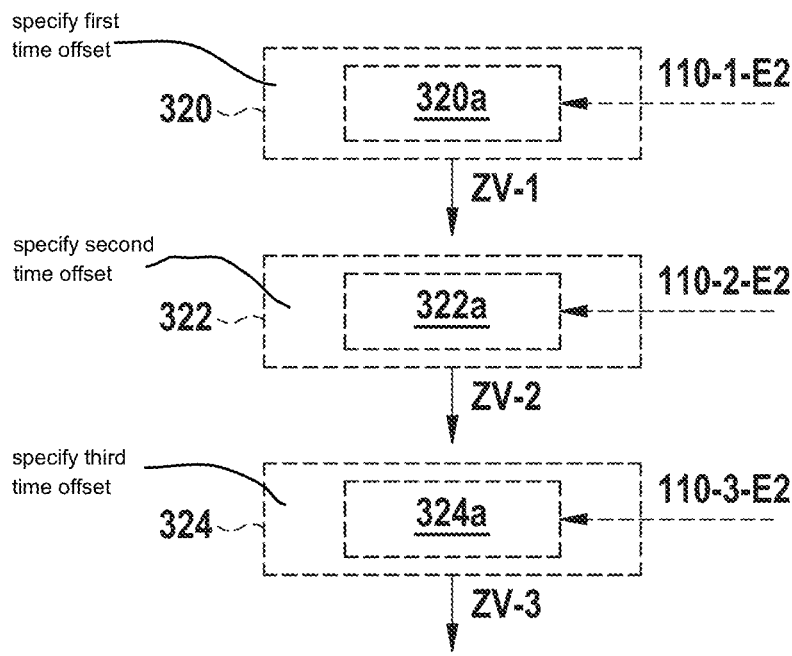
FIG. 15 schematically shows a simplified flowchart according to exemplary embodiments of the present invention.

In further exemplary embodiments, FIG. 15, it is provided that the method comprises at least one of the following elements: a) specifying, for example using, 320 a first time offset ZV-1, for example with respect to a reference time to (e.g. start time for a measurement), for the application 202 of the first control signal 110-1-AS-1 to the control electrode 110-1a of the first transistor 110-1, wherein for example the specifying 320 of the first time offset comprises a specifying 320a of the first time offset ZV-1 based on the second input variable 110-1-E2 associated with the first transistor; b) specifying, for example using, 322 a second time offset ZV-2, for example with respect to the reference time to, for applying 302 the first control signal 110-2-AS-1 to the control electrode 110-2a of the second transistor 110-2, wherein for example the specifying 322 of the second time offset ZV-2 comprises a specifying 322a of the second time offset based on the second input variable 110-2-E2 associated with the second transistor 110-2; c) specifying, for example using, 324 a third time offset ZV-3, for example with respect to the reference time to, for applying 302 the first control signal 110-3-AS-1 to the control electrode 110-3a of the third transistor 110-3, wherein for example the specifying 324 of the third time offset ZV-3 comprises a specifying 324a of the third time offset based on the second input variable 110-3-E2 associated with the third transistor. Obviously, in further exemplary embodiments, at least some of the time offsets ZV-1, ZV-2, ZV-3 can at least periodically be the same or different from each other, for example depending on the relevant second input variables 110-1-E2, 110-2-E2, 110-3-E2.

Figure 16:
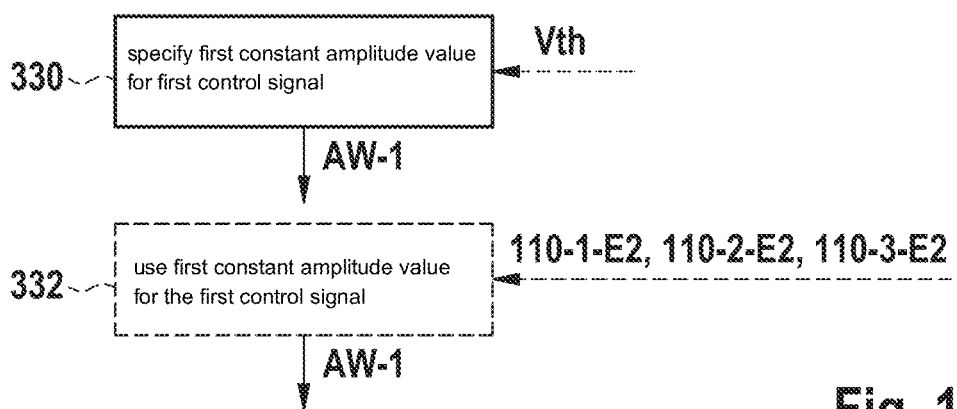
FIG. 16 schematically shows a simplified flowchart according to exemplary embodiments of the present invention.

In further exemplary embodiments, FIG. 16, it is provided that the method comprises: specifying 330, for example using 332, a first, for example constant, amplitude value AW-1 for the first control signal AS-1, 110-1-AS-1, 110-2-AS-1, . . . when the second input variable 110-1-E2, 110-2-E2, 110-3-E2, . . . , for example associated with a relevant first and/or second and/or third transistor (and/or further transistor) has a value smaller than a specifiable minimum value, for example a value of zero, wherein the first amplitude value AW-1 is smaller, for example by a specifiable amount, than a threshold voltage, for example a smallest possible threshold voltage, of at least one of the transistors 110-1, 110-2, 110-3, . . . . In further exemplary embodiments, a leakage current can thereby be reduced, for example in cases in which the second input variable has the value zero. In further exemplary embodiments, the first amplitude value AW-1 can also be negative, for example at least periodically.

Figure 17:
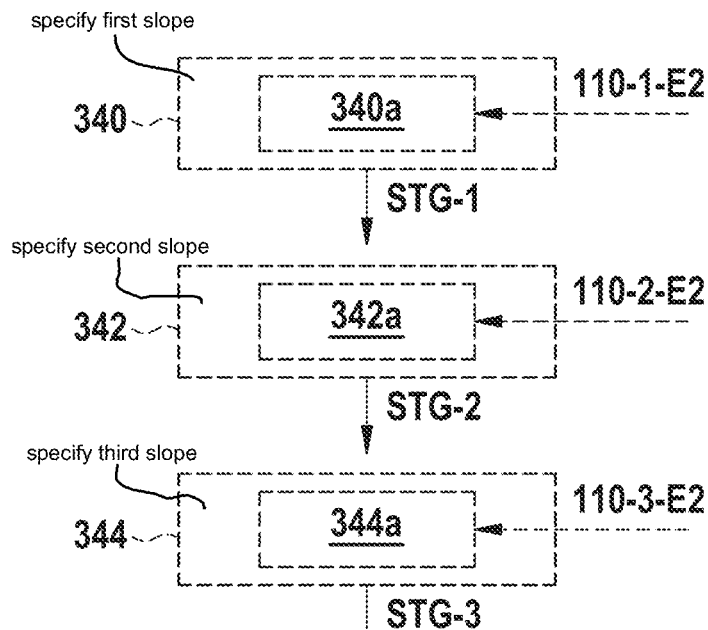
FIG. 17 schematically shows a simplified flowchart according to exemplary embodiments of the present invention.

In further exemplary embodiments, FIG. 17, it is provided that the method comprises at least one of the following elements: a) specifying, for example using, 340 a first slope STG-1 for the increasing time curve of the first control signal 110-1-AS-1 (FIG. 12) for the first transistor 110-1; b) specifying, for example using, 342 a second slope STG-2 for the increasing time curve of the first control signal 110-2-AS-1 for the second transistor 110-2; c) specifying, for example using, 344 a third slope STG-3 for the increasing time curve of the first control signal 110-3-AS-1 for the third transistor 110-3, wherein for example the specifying 340 of the first slope comprises a specifying 340a of the first slope STG-1 based on the second input variable 110-1-E2 associated with the first transistor, wherein for example the specifying 342 of the second slope comprises a specifying 342a of the second slope STG-2 based on the second input variable 110-2-E2 associated with the second transistor, wherein for example the specifying 344 of the third slope comprises a specifying 344a of the third slope STG-3 based on the second input variable 110-3-E2 associated with the third transistor 110-3. Obviously, in further exemplary embodiments, at least some of the slopes STG-1, STG-2, STG-3 can at least periodically be the same or different from each other, for example depending on the relevant second input variables 110-1-E2, 110-2-E2, 110-3-E2.

In further exemplary embodiments, FIG. 1, 12, it is provided that at least the first transistor 110-1, for example a plurality of transistors 110-1, 110-2, 110-3, has or have a corresponding current-limiting function SBF-1, SBF-2, SBF-3 for limiting a current I-LS (FIG. 1), I-1-LS, I-2-LS, I-3-LS (FIG. 12) through its load path, wherein for example the current-limiting function SBF-1, SBF-2, SBF-3 is implemented by means of at least one of the following elements: a) a setting of a voltage for the control electrode 110-1a, 110-2a, 110-3a of the relevant transistor 110-1, 110-2, 110-3, for example such that a maximum specifiable current through the load path is not exceeded; b) a current-limiting element SBE-1, SBE-2, . . . (FIG. 27), for example a resistor or a transistor SBT-1, SBT-2, . . . configured as a resistor, for example a field-effect transistor, in series with the load path 110-1-LS, 110-2-LS, . . . .

Figure 18:
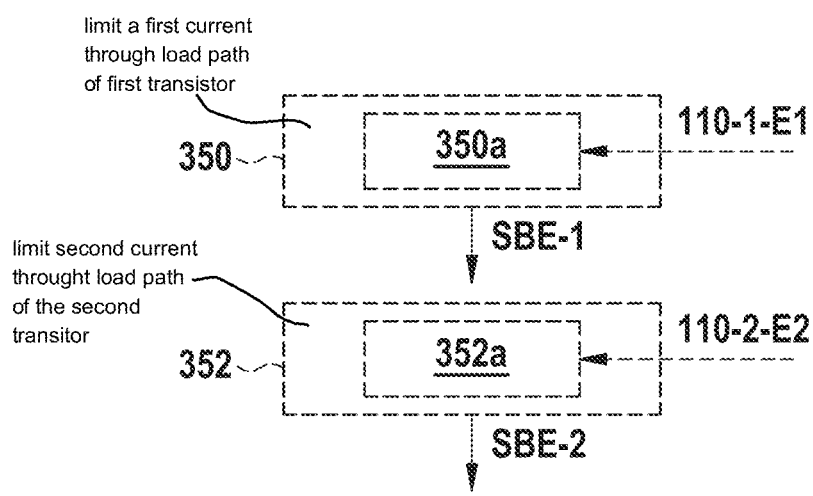
FIG. 18 schematically shows a simplified flowchart according to exemplary embodiments of the present invention.

In further exemplary embodiments, FIG. 18, it is provided that the method comprises at least one of the following elements: a) at least periodically limiting 350 a first current I-1-LS (FIG. 12) through the load path of the first transistor 110-1, for example by means of a first current-limiting element SBE-1 (FIG. 18), for example comprising a resistor or a transistor configured as a resistor, for example a field-effect transistor, wherein for example the limiting 350 of the first current through the load path of the first transistor comprises a limiting 350a of the first current I-1-LS based on the second input variable 110-1-E2 associated with the first transistor 110-1; b) at least periodically limiting 352 a second current I-2-LS (FIG. 12) through the load path of the second transistor 110-2, for example by means of a second current-limiting element SBE-2 (FIG. 18), for example comprising a resistor or a transistor configured as a resistor, for example a field-effect transistor, wherein for example the limiting 352 of the second current through the load path of the second transistor comprises a limiting 352a of the second current based on the second input variable 110-2-E2 associated with the second transistor 110-2.

Figure 19:
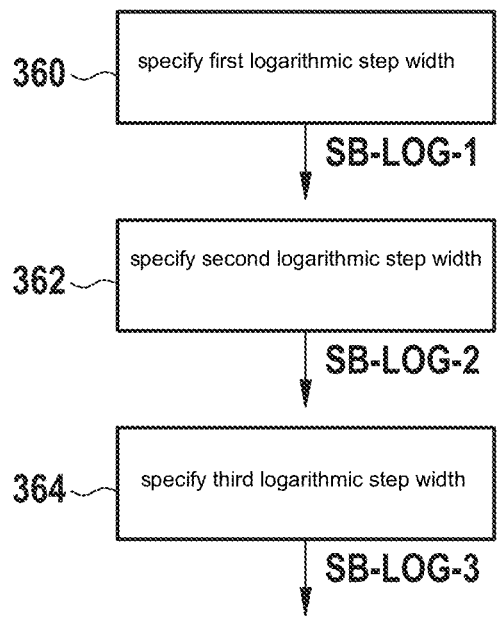
FIG. 19 schematically shows a simplified flowchart according to exemplary embodiments of the present invention.
Figure 20:
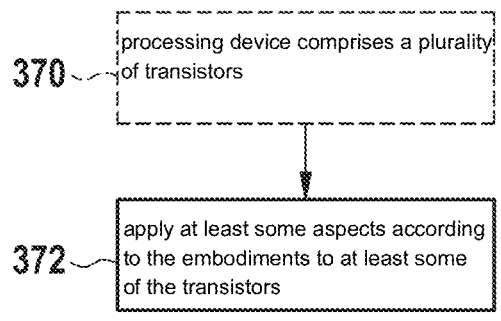
FIG. 20 schematically shows a simplified flowchart according to exemplary embodiments of the present invention.

In further exemplary embodiments, FIG. 19, it is provided that the method comprises at least one of the following elements: specifying, for example using, 360 a first logarithmic step width SB-LOG-1 which changes logarithmically over time, for example increases, for the stepped shape TF (FIG. 10) of the first control signal 110-1-AS-1 (FIG. 12) for the first transistor; b) specifying, for example using, 362 a second logarithmic step width SB-LOG-2 which changes logarithmically over time, for example increases, for the stepped shape of the first control signal 110-2-AS-1 for the second transistor 110-2; c) specifying, for example using, 364 a third logarithmic step width SB-LOG-3 which changes logarithmically over time, for example increases, for the stepped shape TF of the first control signal 110-3-AS-1 for the third transistor 110-3, wherein for example the specifying 360 of the first logarithmic step width is done based on the second input variable 110-1-E2 associated with the first transistor, wherein for example the specifying 362 of the second logarithmic step width is done based on the second input variable 110-2-E2 associated with the second transistor, wherein for example the specifying 364 of the third logarithmic step width is done based on the second input variable 110-3-E2 associated with the third transistor.

In further exemplary embodiments, FIG. 10, for example a step height SH can also be changed and for example a step width SB can be retained for the first control signal AS-1 (FIG. 2), 110-1-AS-1, 110-2-AS-1, 110-3-AS-1 (FIG. 12).

In further exemplary embodiments, FIG. 10, for example a step height SH can also be changed and for example the step width SB can also be changed for the first control signal AS-1 (FIG. 2), 110-1-AS-1, 110-2-AS-1, 110-3-AS-1 (FIG. 12).

In further exemplary embodiments, FIG. 12, 20, it is provided that the processing device 100a comprises 370 a plurality of transistors 110-1, 110-2, 110-3, . . . (e.g. a few tens of transistors or a few hundred transistors or a few thousand transistors or more), wherein at least some aspects according to the embodiments are applied to at least some transistors of the plurality of transistors; see block 372.

Figure 21:
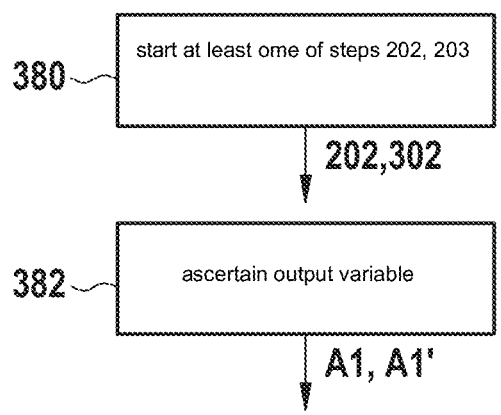
FIG. 21 schematically shows a simplified flowchart according to exemplary embodiments of the present invention.

In further exemplary embodiments, FIG. 21, it is provided that the method comprises: starting 380 at least one of the following elements at a reference time to: a) applying 202 the first control signal 110-1-AS-1 to the control electrode 110-1a of the first transistor 110-1 (FIG. 12); b) applying 302 a or the corresponding first control signal 110-2-AS-1, 110-3-AS-1 to a corresponding control electrode 110-2a, 110-3a (FIG. 12) of at least one further transistor 110-2, 110-3 or the at least one further transistor; ascertaining 382 the output variable A1, A1' after a specifiable period of time.

Further exemplary embodiments, FIG. 2, relate to a device 1000 for carrying out the method according to the embodiments.

In further exemplary embodiments, it is provided that the device 1000 comprises a processing device 100, 100a (FIG. 12) comprising at least a first transistor 110-1, 110-2, . . . , for example a field-effect transistor, with a first memristive circuit device MR-1, wherein the first memristive circuit device characterizes a first input variable E1, 110-1-E1 associated with the first transistor 110-1, wherein for example the processing device 100, 100a comprises a number n, where n>1, of transistors, for example field-effect transistors.

In further exemplary embodiments, FIG. 2, 12, it is provided that the device 1000 comprises a plurality of transistors 110-1, 110-2, 110-3, . . . and a plurality of memristive circuit devices MR-1, MR-2, MR-3, . . . , wherein for example each one of the plurality of memristive circuit devices MR-1, MR-2, MR-3, . . . is associated with a corresponding one of the plurality of transistors 110-1, 110-2, 110-3, . . . .

Figure 28A:
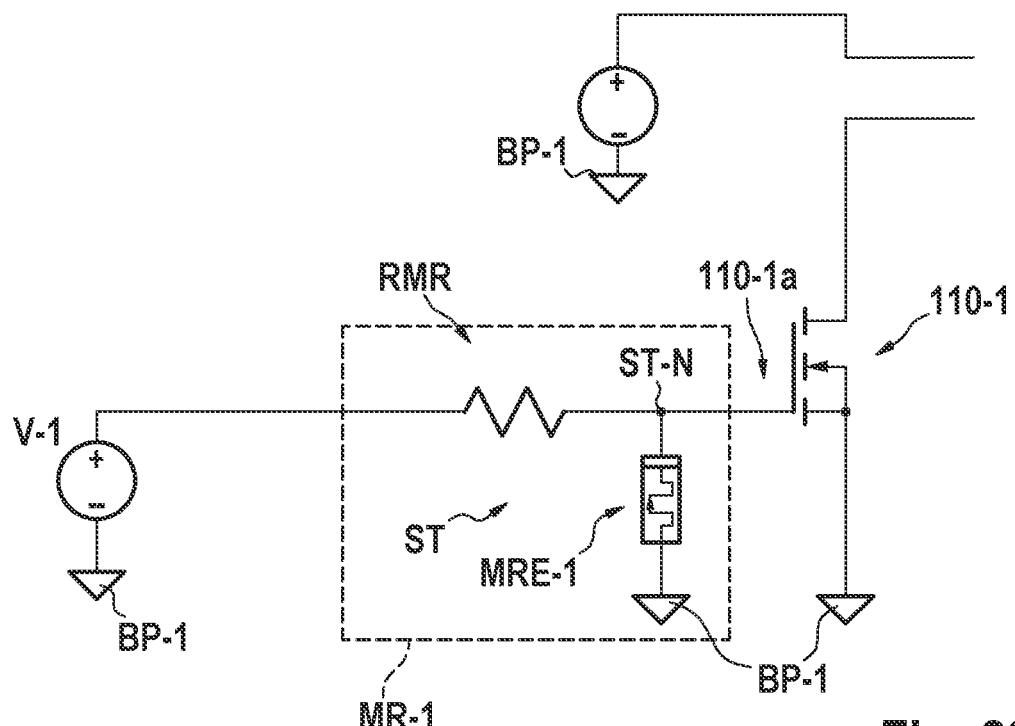
FIG. 28A schematically shows a simplified circuit diagram according to exemplary embodiments of the present invention.
Figure 28B:
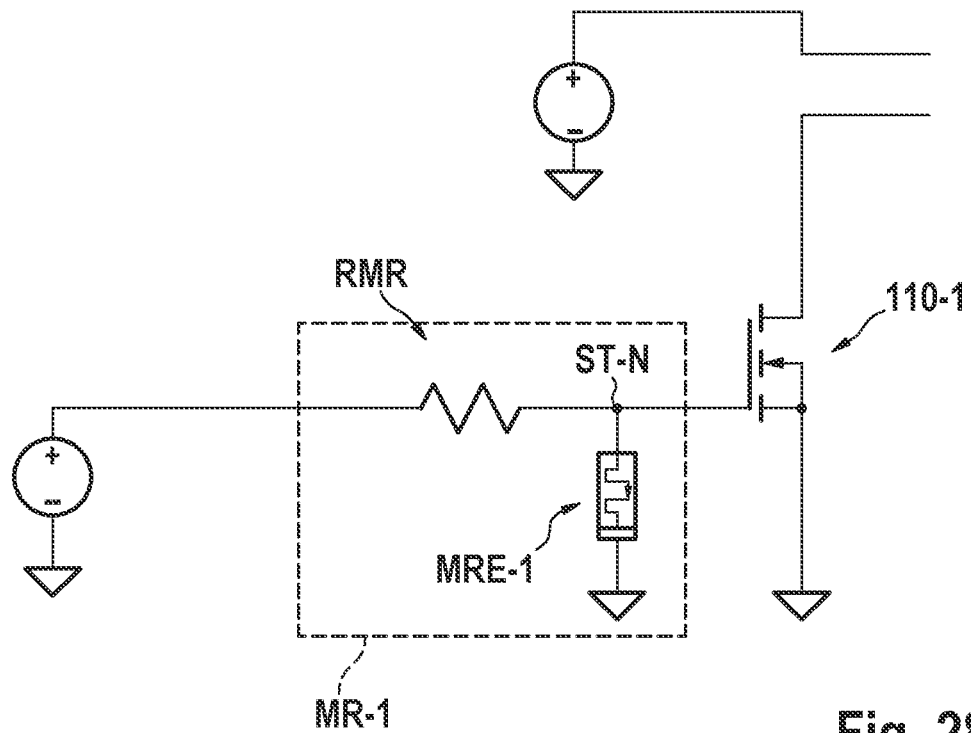
FIG. 28B schematically shows a simplified circuit diagram according to exemplary embodiments of the present invention.
Figure 28C:
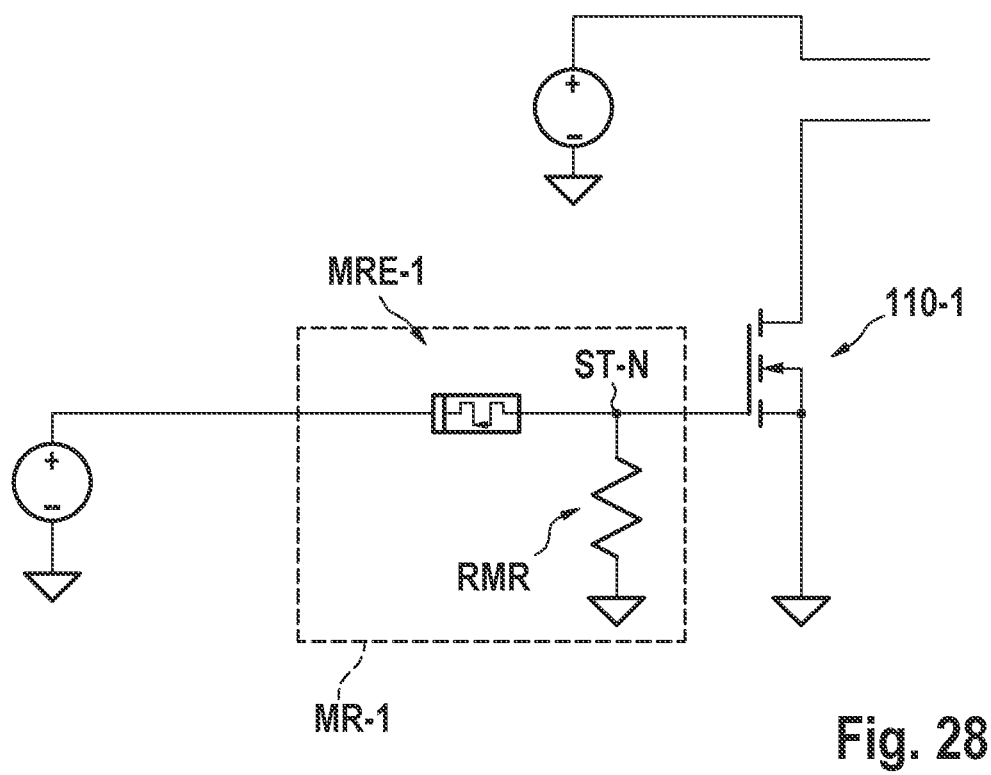
FIG. 28C schematically shows a simplified circuit diagram according to exemplary embodiments of the present invention.

In further exemplary embodiments, FIG. 28A, 28B, 28C, it is provided that at least the first memristive circuit device MR-1 comprises at least one memristive element MRE-1, wherein for example in the case of a plurality of memristive circuit devices (see e.g. FIG. 12), each of the plurality of memristive circuit devices comprises at least one memristive element.

In further exemplary embodiments, FIG. 28A, it is provided that the first memristive circuit device MR-1 comprises a voltage divider ST with at least a first memristive element MRE-1, wherein the application to the control electrode 110-1a of the first transistor 110-1 is done by means of the voltage divider ST. For example, in further exemplary embodiments, the voltage divider ST may have a series circuit of the first memristive element MRE-1 and a resistive element, e.g. ohmic resistor, RMR, which here is arranged between the voltage source V-1 and the ground potential BP-1. A circuit node ST-N of the voltage divider ST is connected to the control electrode 110-1a of the transistor 110-1, as an example. Obviously, an electrical potential at the circuit node ST-N follows the voltage divider rule, so that for example in some embodiments there is no, e.g. direct, proportionality between for example a programmed state of the memristive element MRE-1 and the electrical potential at the circuit node ST-N. However, this does not impair the evaluation of calculation tasks in accordance with the design according to the embodiments.

FIG. 28B shows a configuration similar to FIG. 28A according to further exemplary embodiments, but in which a polarity of the first memristive element MRE-1 between the elements ST-N and BP-1 is reversed compared to FIG. 28A.

FIG. 28C shows a configuration similar to FIG. 28A according to further exemplary embodiments, in which the first memristive element MRE-1 is arranged between the voltage source and the circuit node ST-N. Other topologies deviating from this are also possible in further exemplary embodiments, e.g. in order to realize the corresponding memristive circuit device, e.g. for applying a corresponding first control signal AS-1, 110-1-AS-1, . . . to a control electrode of a transistor. For example, in further exemplary embodiments (not shown), the voltage divider ST may comprise a series circuit of the first memristive element MRE-1 and a second memristive element (not shown), and so on.

By specifying a resistance ratio of the components MRE-1, RMR of the voltage divider ST, in further exemplary embodiments for example a transfer function of the first memristive circuit device MR-1 can be specified for the first control signal, and thus for example a switching behavior of the transistor 110-1 in question can be influenced, whereby in further exemplary embodiments for example a change in a threshold voltage (which is e.g. fixed in itself) of the transistor in question can be emulated.

In further exemplary embodiments, FIG. 28A, it is provided that the at least one memristive element MRE-1 has one of the following types, for example is formed as one of the following types: a) memristor; b) resistive random access memory, for example RRAM, for example resistive random access memory; c) phase change memory, for example PCM; d) metal oxide resistive memory, for example OxRAM; e) further, for example two-pole, memristive element, for example memory element.

In further exemplary embodiments, FIG. 28A, an electrical resistance of the at least one memristive element MRE-1 (and thus for example also a transfer function of the memristive circuit device MR-1, MR-2, . . . comprising the at least one memristive element MRE-1) can, for example can be specified by programming, whereby the at least one memristive element MRE-1 can be assigned for example a value for the first input variable E1, 110-1-E1, 110-2-E1, . . . which, as already described above, acts on the charging current I-L1 (FIG. 2) of the capacitance C-1a associated with the control electrode 110-1a. For example, according to the value of the first input variable E1, the at least one memristive element MRE-1 can limit the charging current, for example for a Miller capacitance of the first transistor, and thus realize, for example, a time behavior dependent on the Miller capacitance and on the value of the first input variable for activating (switching from a non-conductive state into a conductive state) the first transistor.

In further exemplary embodiments, FIG. 28C, when the memristor MRE-1 is the component connected to the input voltage source (configuration shown in FIG. 28C), comparatively smaller resistance values cause for example an apparent threshold voltage of the associated transistor 110-1 to increase.

In further exemplary embodiments, if the component of the voltage divider ST that is connected to the ground BP-1 is the memristor MRE-1 (FIG. 28A, 28B), then comparatively smaller resistance values lead for example to a reduction in the apparent threshold voltage of the associated transistor 110-1.

In further exemplary embodiments, the memristive circuit device MR-1 can also be formed, for example, with at least two memristors (not shown), which would for example not fundamentally change the mode of operation, but which can for example increase thermal stability, e.g. if both components have the same temperature dependence.

In further exemplary embodiments, the use of two memristive components in a memristive circuit device MR-1 may enable more possible programmable states, e.g. for the voltage divider ST.

In further exemplary embodiments, if for example a memristor MRE-1 is used and it can store e.g. 2 bits, this means that it can specify e.g. one of four possible apparent threshold values for the associated transistor 110-1.

In further exemplary embodiments, e.g. a numerical value of zero, "0," is assigned to a highest apparent threshold value for the transistor 110-1.

In further exemplary embodiments, e.g. the highest numerical value, for example "3," is assigned to a lowest apparent threshold value for the transistor 110-1.

In further exemplary embodiments, FIG. 2, it is provided that the device 1000 has at least one analog/digital converter 20, for example a current-based analog/digital converter 20a and/or a voltage-based analog/digital converter 20b.

In further exemplary embodiments, FIG. 2, it is provided that the device 1000 has at least one capacitor 22 which can be charged at least periodically by means of at least one current I-LS through at least one load path 110-1-LS of at least one transistor. In further exemplary embodiments, the capacitor 22 accumulates, for example integrates, the current contributions, which e.g. change over time, of the individual transistors 110-1 (FIG. 2), 110-1, 110-2, 110-3, . . . (FIG. 12), e.g. such that the output variable A1, A1' can be ascertained, e.g. based on the voltage U-I-LS of the capacitor 22 (for example observed at an end of a measurement period).

In further exemplary embodiments, FIG. 2, it is provided that the device 1000 has a discharge device 23 for at least periodically discharging the capacitor 22, whereby e.g. a "result" of a preceding calculation can be reset by means of the processing device 100, 100a, so that for example a further calculation can be carried out. For example, the discharge device 23 can have at least one discharge transistor or switch (not shown).

In further exemplary embodiments, FIG. 2, it is provided that the device 1000 has a programming device 24 for programming at least one component MRE-1 of the first memristive circuit device MR-1 and/or at least one component of at least one further memristive circuit device MR-2, MR-3, . . . , that may be present, e.g. to a specifiable resistance value. For example, different discrete values of the first input variable E1 can be encoded in each case by programming, which, as already described above, cause for example an apparent change in the threshold voltage of a corresponding transistor 110-1 which is controlled by means of the memristive circuit device MR-1 programmed in this way.

In the case of the optional provision of at least one transistor of the FeFET type (not shown), in further exemplary embodiments it can be provided that the programming device 24 is (e.g. also) designed for programming the FeFET.

Figure 27:
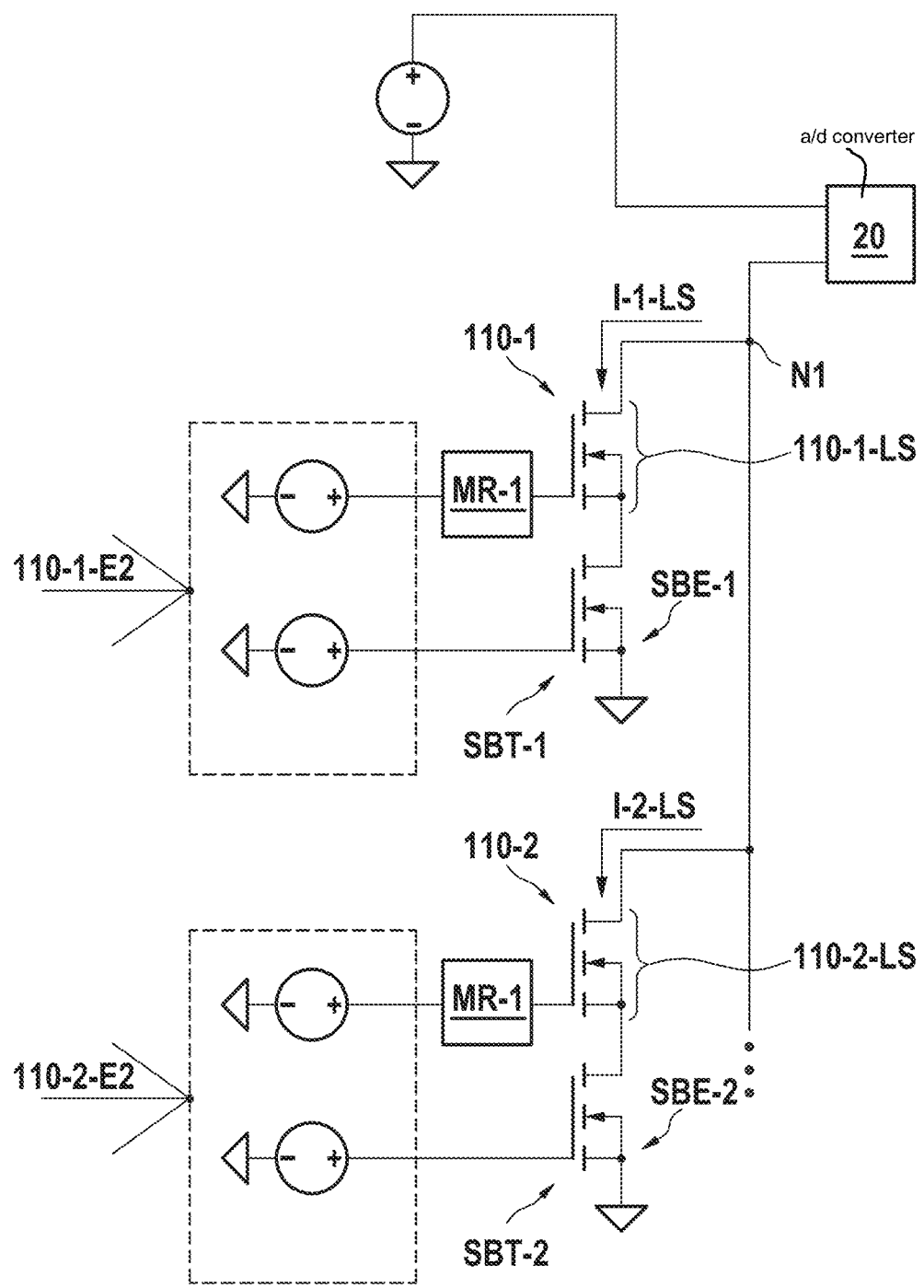
FIG. 27 schematically shows a simplified circuit diagram according to exemplary embodiments of the present invention.

In further exemplary embodiments, FIG. 2, 27, it is provided that the device 1000 comprises at least one of the following elements: a) a first current-limiting element SBE-1 (FIG. 27), for example comprising a resistor or a transistor SBT-1 configured as a resistor, for example a field-effect transistor, for at least periodically limiting a first current I-1-LS through the load path 110-1-LS of the first transistor 110-1; b) a second current-limiting element SBE-2, for example comprising a resistor or a transistor SBT-2 configured as a resistor, for example a field-effect transistor, for at least periodically limiting a second current I-2-LS through the load path 110-2-LS of the second transistor 110-2.

In further exemplary embodiments, FIG. 27, it is provided that a) the first current-limiting element SBE-1 is designed to limit the first current non-constantly over time, for example variably, for example on the basis of the second input variable 110-1-E2 associated with the first transistor 110-1, and/or that b) the second current-limiting element SBE-2 is designed to limit the second current non-constantly over time, for example variably, for example, on the basis of the second input variable 110-2-E2 associated with the second transistor 110-2. In other exemplary embodiments, e.g. a dynamic current limiting can thus be realized based on the corresponding (second) input variables. This is symbolized in FIG. 27 by separate, unmarked voltage sources for controlling the corresponding control electrodes of the current-limiting transistors SBT-1, SBT-2. The transistors 110-1, 110-2 are controlled as already described via the memristive switching devices MR-1, MR-2, for example with at least periodically non-constant amplitude, e.g. stepped shape TF (FIG. 10) or with a curve MSV according to FIG. 11.

In further exemplary embodiments, FIG. 2, it is provided that the device has at least one charging device or control device 12 which is designed to provide, at least periodically, at least one of the following elements: a) the first control signal AS-1, 110-1-AS-1 (FIG. 12) for the first transistor 110-2; b) the first control signal 110-2-AS-1 for the second transistor 110-2 (FIG. 12); c) the first control signal 110-3-AS-1 for the third transistor 110-3.

In further exemplary embodiments, FIG. 2, it is provided that the device 1000 comprises a control device 400 which is designed to execute at least one of the following elements: a) control of at least one component of the device 1000; b) execution of at least one aspect of the method according to the embodiments.

Figure 22:
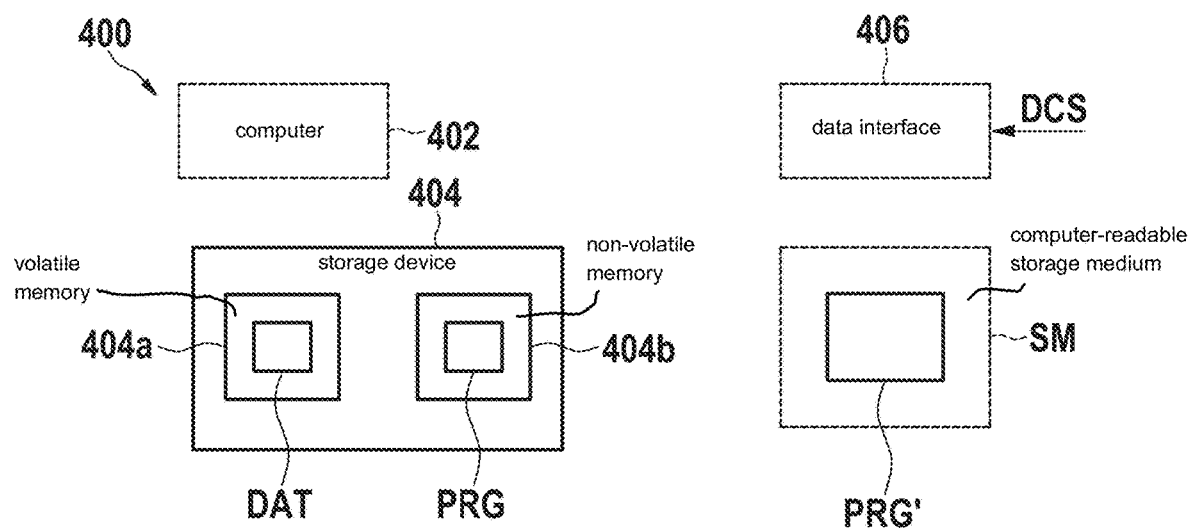
FIG. 22 schematically shows a simplified block diagram according to further exemplary embodiments of the present invention.

FIG. 22 shows by way of example a configuration of the control device 400 according to further exemplary embodiments. By way of example, the control device 400 comprises: a computing device ("computer") 402 having at least one computing core (not shown); a storage device 404 associated with the computing device 402 for at least periodically storing at least one of the following elements: a) data DAT (for example, data associated with at least one component of the device 1000 or of the processing device 100, 100a, for example possible values for the first input variable E1 and/or possible values for the second input variable E2, and/or data relating to the current configuration (for example characterizing how the memristive circuit devices MR-1, MR-2, MR-3 are currently programmed and/or which values are currently being provided for the first control signal AS-1, 110-1-AS-1, . . . , e.g. the step width and/or step height and/or a time offset)); b) computer program PRG, for example for carrying out the method according to the embodiments.

In further exemplary embodiments, the storage device 404 has a volatile memory (for example, working memory (RAM)) 404a, and/or a non-volatile memory (NVM) (for example, flash EEPROM) 404b, or a combination thereof or with other memory types not explicitly mentioned.

Alternatively, the control device 400 can also be designed, for example, as an ASIC (application-specific integrated circuit) and/or as a programmable logic circuit, for example FPGA, and/or as a microcontroller and/or as a digital signal processor and/or as an accelerator circuit, for example for matrix calculation operations, and/or as, for example, a pure hardware circuit, for example a digital circuit, and/or have at least one of these elements.

Further exemplary embodiments, FIG. 22, relate to a computer-readable storage medium SM comprising commands PRG' that, when executed by a computer 402, cause said computer to carry out the method according to the embodiments.

Further exemplary embodiments relate to a computer program PRG, PRG' comprising commands that, when the program PRG, PRG' is executed by a computer 402, cause said computer to carry out the method according to the embodiments.

Further exemplary embodiments relate to a data carrier signal DCS that characterizes and/or transmits the computer program PRG according to the embodiments. The data carrier signal DCS can be received, for example, via an optional data interface 406 of the apparatus 400.

Figure 23:
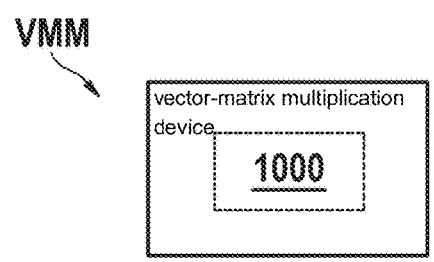
FIG. 23 schematically shows a simplified block diagram according to further exemplary embodiments of the present invention.

Further exemplary embodiments, FIG. 23, relate to a computing device, for example a vector-matrix multiplication device VMM, comprising at least one device 1000 according to the embodiments.

Figure 24:
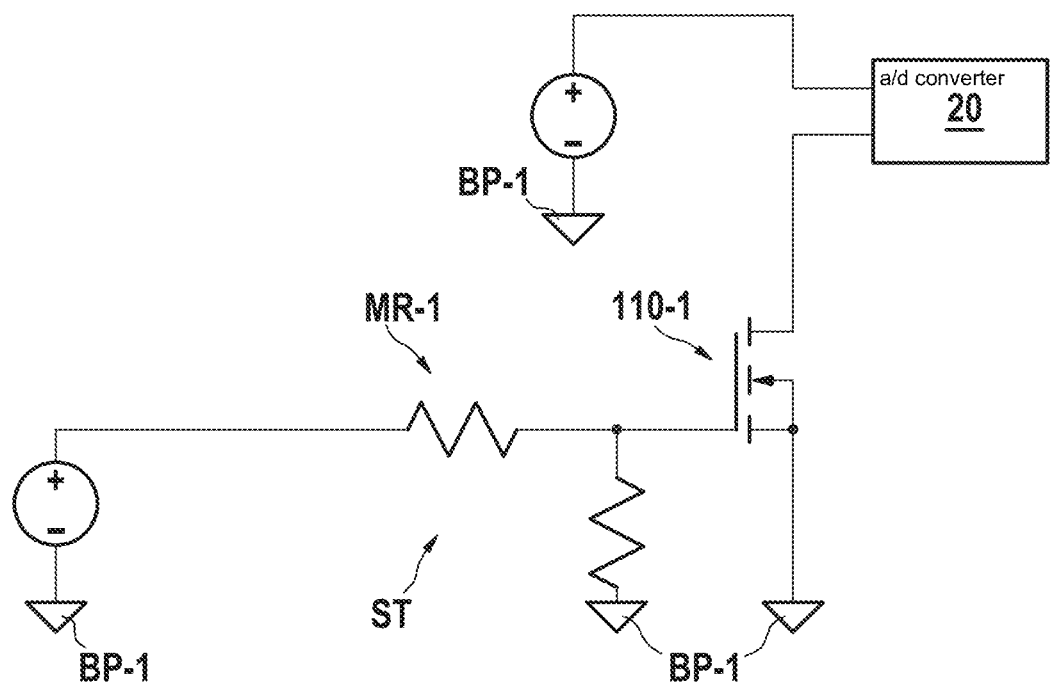
FIG. 24 schematically shows a simplified circuit diagram according to exemplary embodiments of the present invention.

FIG. 24 schematically shows a circuit configuration according to exemplary embodiments, in which the transistor 110-1 is driven with a first control signal by means of the memristive circuit device MR-1, which has a voltage divider ST. A current through the load path of the transistor 110-1 can be ascertained by means of the analog/digital converter 20.

Figure 25A:
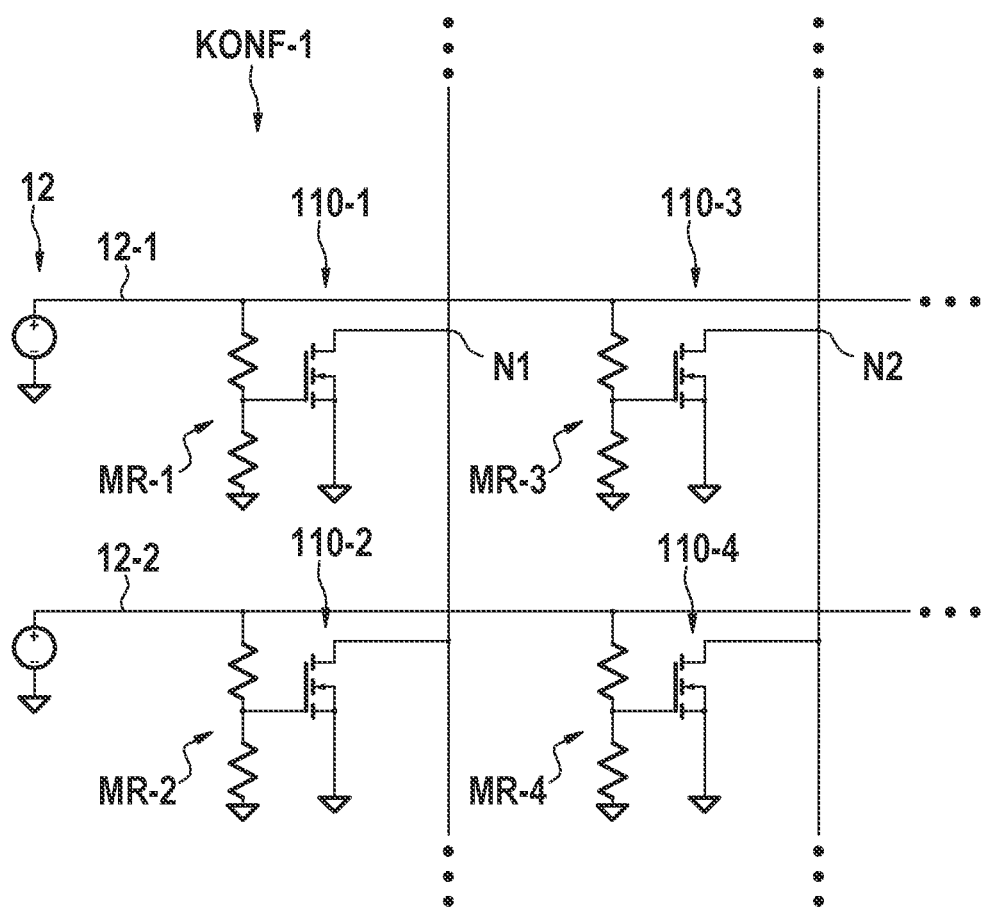
FIG. 25A schematically shows a simplified circuit diagram according to exemplary embodiments of the present invention.

FIG. 25A schematically shows a circuit configuration KONF-1 according to exemplary embodiments, in which four transistors 110-1, 110-2, 110-3, 110-4 are provided in the present case and are controlled via a relevant memristive switching device MR-1, MR-2, MR-3, MR-4. The memristive circuit devices MR-1, MR-3 are supplied with a first control signal for controlling the transistors 110-1, 110-3 via a first control line 12-1, and the memristive circuit devices MR-2, MR-4 are supplied with a first control signal for controlling the transistors 110-2, 110-4 via a second control line 12-2. Currents through the load paths of the transistors 110-1, 110-2 can be detected at the circuit node N1, for example in the same way as currents through the load paths of any other transistors not shown, the load paths of which are also connected to the circuit node N1. Currents through the load paths of the transistors 110-3, 110-4 can be detected at the circuit node N2, for example in the same way as currents through the load paths of any other transistors not shown, the load paths of which are also connected to the circuit node N2.

The exemplary circuit configuration KONF-1 according to FIG. 25A symbolizes a matrix-shaped arrangement of a plurality of transistors 110-1, 110-2, . . . and associated memristive circuit devices MR-1, MR-2, . . . according to exemplary embodiments, which, e.g. according to further exemplary embodiments, is expandable e.g. horizontally and/or vertically. For example, in further exemplary embodiments a "matrix array" can be provided of which the rows can be controlled together by means of a corresponding first control signal and of which the columns can be evaluated together e.g. by detecting the current occurring at each circuit node N1, N2, . . . .

Figure 25B:
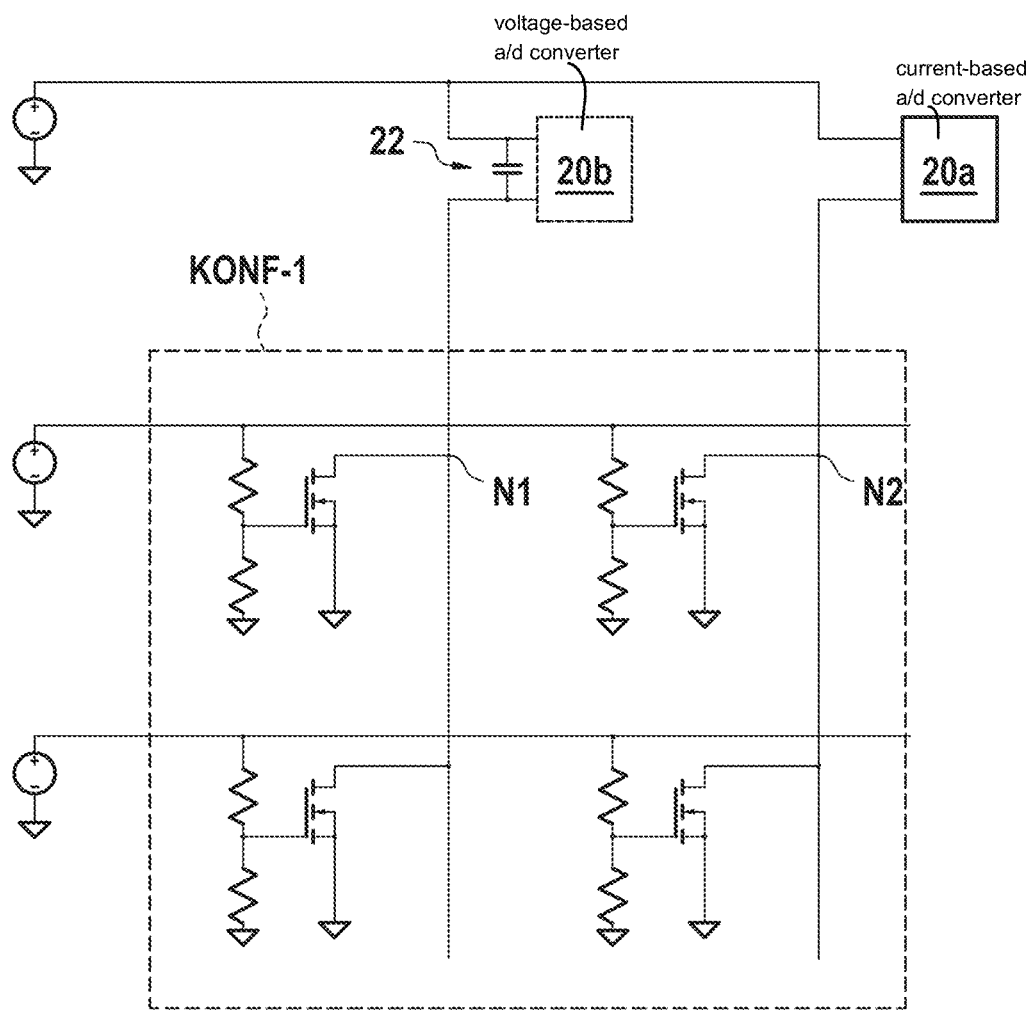
FIG. 25B schematically shows a simplified circuit diagram according to exemplary embodiments of the present invention.

FIG. 25B reproduces the exemplary circuit configuration KONF-1 according to FIG. 25A and additionally shows a capacitor 22 connected to the circuit node N1 with an associated voltage-based analog-to-digital converter 20b for detecting the voltage of the capacitor 22 and a current-based analog-to-digital converter 20a for detecting a current associated with the circuit node N2.

Figure 26:
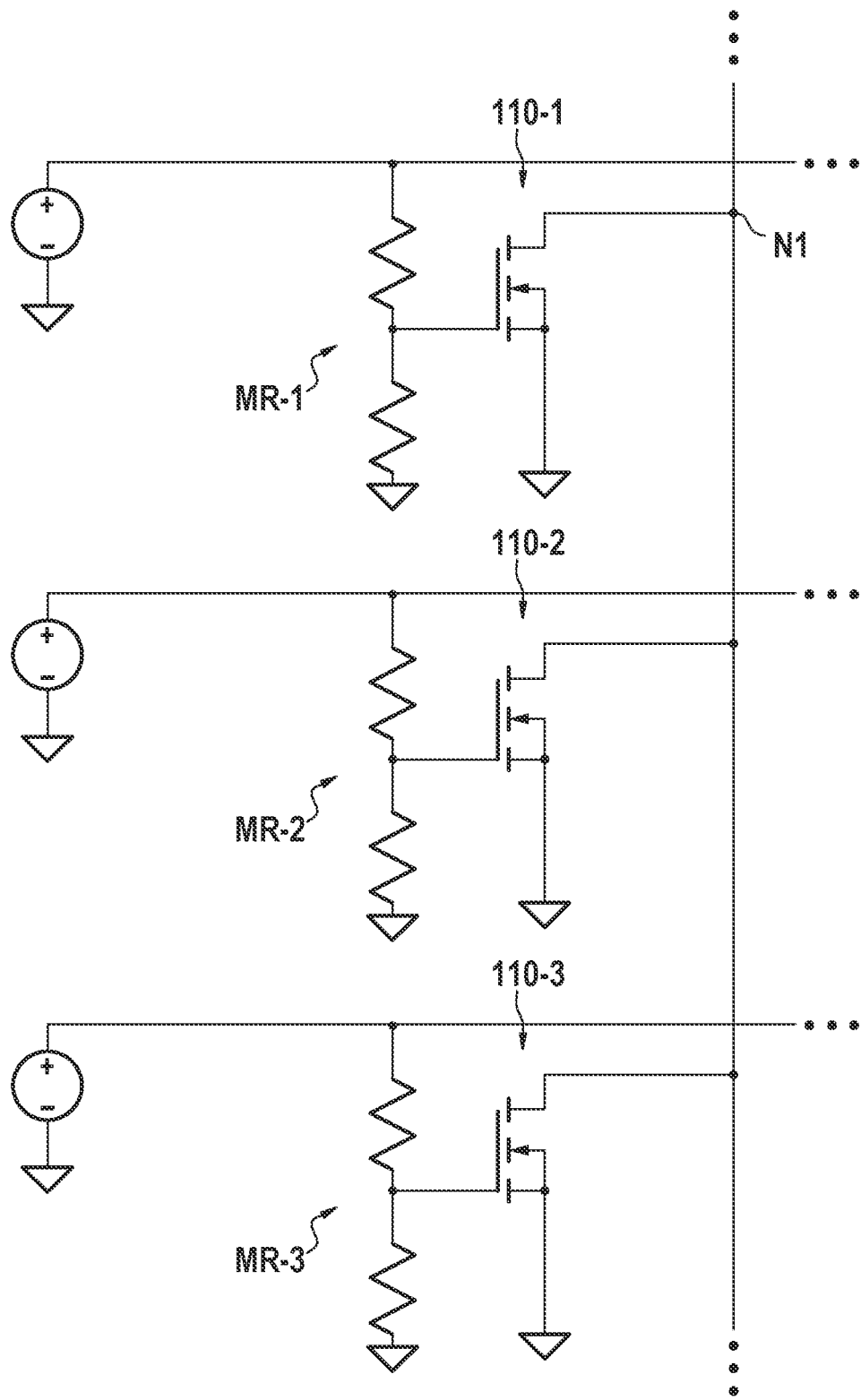
FIG. 26 schematically shows a simplified circuit diagram according to exemplary embodiments of the present invention.

FIG. 26 shows an exemplary circuit configuration according to further exemplary embodiments, with three transistors 110-1, 110-2, 110-3 and correspondingly associated memristive circuit device MR-1, MR-2, MR-3, each symbolized by way of example as a voltage divider, and FIG. 29A, 29B, 29C schematically each show control signals according to exemplary embodiments, such as can be used for an operation of the circuit configuration according to FIG. 26.

FIG. 29A schematically shows possible first control signals AS-1A, AS-1B, for example control voltages V, for example for the first transistor 110-1 (FIG. 2, 12, 26), according to further exemplary embodiments. The stepped first control signal AS-1A has a step width SB-A, and the monotonically increasing first control signal AS-1B has a first slope. A time offset ZV-A of the two first control signals AS-1A, AS-1B according to FIG. 29A is zero. Possible apparent threshold voltages which can be realized by means of the first memristive circuit device MR-1 (FIG. 26) (e.g. by programming the first memristive element MRE-1) are symbolized in FIG. 29A by the horizontal dashed lines and the numbers "0," "1," "2," "3" along the vertical axis V. In further exemplary embodiments, starting from the reference time to, the control signals increase from the amplitude zero up to a prespecifiable maximum value (not shown), namely the stepped first control signal AS-1A, which by way of example has three steps, in each case at the times t0, t3, t6 (see common time axis according to FIG. 29C), and the monotonically increasing first control signal AS-1B with the first slope, corresponding to 1/x1, wherein the value "x1" corresponds for example to a numerical input value for the second input variable 110-1-E2 associated with the first transistor 110-1.

FIG. 29B schematically shows possible second control signals AS-2A, AS-2B, for example control voltages V, for example for the second transistor 110-2 (FIG. 2, 12, 26), according to further exemplary embodiments. The stepped second control signal AS-2A has a step width SB-B which is smaller than the step width SB-A according to FIG. 29A, and the monotonically increasing first control signal AS-2B has a second slope which is greater than the first slope of the control signal AS-1B according to FIG. 29A. A time offset ZV-B of the two first control signals AS-2A, AS-2B according to FIG. 29B is greater than zero. Thus, starting from the time t3, the control signals AS-2A, AS-2B increase from the amplitude zero to the prespecifiable maximum value (not shown), namely the first control signal AS-1B by way of example with three steps at the times t3, t5, t7, and the first control signal AS-1B with a third slope which corresponds to 1/x2, wherein the value "x2" corresponds for example to a numerical input value for the second input variable 110-2-E2 associated with the second transistor 110-2.

FIG. 29C schematically shows possible third control signals AS-3A, AS-3B, for example control voltages V, for example for the third transistor 110-3 (FIG. 2, 12, 26), according to further exemplary embodiments. The stepped second control signal AS-3A has a step width SB-C which is smaller than the step width SB-B according to FIG. 29B, and the monotonically increasing first control signal AS-3B has a slope which is greater than the slope of the control signal AS-2B according to FIG. 29B. A time offset ZV-C of the two first control signals AS-3A, AS-3B according to FIG. 29C is greater than the time offset ZV-B from FIG. 29B. Thus, starting from the time t6, the control signals AS-3A, AS-3B increase from the amplitude zero to the prespecifiable maximum value (not shown), namely the first control signal AS-3B by way of example with three steps at the times t6, t7, t8, and the first control signal AS-3B with a third slope which corresponds to 1/x3, wherein the value "x3" corresponds for example to a numerical input value for the second input variable 110-3-E2 associated with the third transistor 110-3.

In further exemplary embodiments, the stepped control signals AS-1A, AS-2A, AS-3A characterize the numerical input values x1, x2, x3 in a comparable manner, relative to the monotonically increasing control signals AS-1B, AS-2B, AS-3B. In further exemplary embodiments, the stepped control signals AS-1A, AS-2A, AS-3A minimize leakage currents in the transistors 110-1, 110-2, 110-3, compared to the monotonically increasing control signals AS-1B, AS-2B, AS-3B.

For example, the first memristive circuit device MR-1 according to FIG. 26 may be configured, e.g., programmed, such that the transistor 110-1 controllable thereby has an apparent threshold voltage "1" on the vertical axis V according to FIG. 29A. The first transistor 110-1 is then conductive for example in a time interval in which the first control signal AS-1A or AS-1B exceeds the threshold value "1" on the vertical axis V according to FIG. 29A, resulting in a current contribution through the first transistor 110-1 into/from the first circuit node N1 that characterizes for example the calculation 3*1=3, wherein the factor "3" results from the selection of the first control signal AS-1A or AS-1B (e.g. associated with the second input variable), and wherein the factor "1" results from the above-mentioned configuration of the first memristive circuit device MR-1 (e.g. associated with the first input variable).

For example, the second memristive circuit device MR-2 according to FIG. 26 can be configured, e.g. programmed, such that the transistor 110-2 controllable thereby has an apparent threshold voltage "3" on the vertical axis V according to FIG. 29B. The second transistor 110-2 is then conductive e.g. in a time interval in which the first control signal AS-2A or AS-2B exceeds the threshold value "3" on the vertical axis V according to FIG. 29B, resulting in a current contribution through the second transistor 110-2 into/from the first circuit node N1 characterizing e.g. the calculation 2*3=6, wherein the factor "2" results from the selection of the first control signal AS-2A or AS-2B (e.g. associated with the second input variable), and wherein the factor "3" results from the above-mentioned configuration of the second memristive circuit device MR-2 (e.g. associated with the first input variable).

For example, the third memristive circuit device MR-3 according to FIG. 26 may be configured, e.g., programmed, such that the transistor 110-3 controllable thereby has an apparent threshold voltage "2" on the vertical axis V according to FIG. 29C. The third transistor 110-3 is then conductive e.g. in a time interval in which the first control signal AS-3A or AS-3B exceeds the threshold "2" on the vertical axis V according to FIG. 29C, resulting in a current contribution through the third transistor 110-3 into/from the first circuit node N1 characterizing e.g. the calculation 1*2=2, wherein the factor "1" results from the selection of the first control signal AS-3A or AS-3B (e.g. associated with the second input variable), and wherein the factor "2" results from the above-mentioned configuration of the third memristive circuit device MR-3 (e.g. associated with the first input variable).

As a result, the value 3+6+2=11 can be ascertained in this way based on the total current through the circuit node N1, for example in the form of a time curve of the total current through the circuit node N1 or an associated charge on the capacitor 22 (FIG. 2).

Figure 30A:
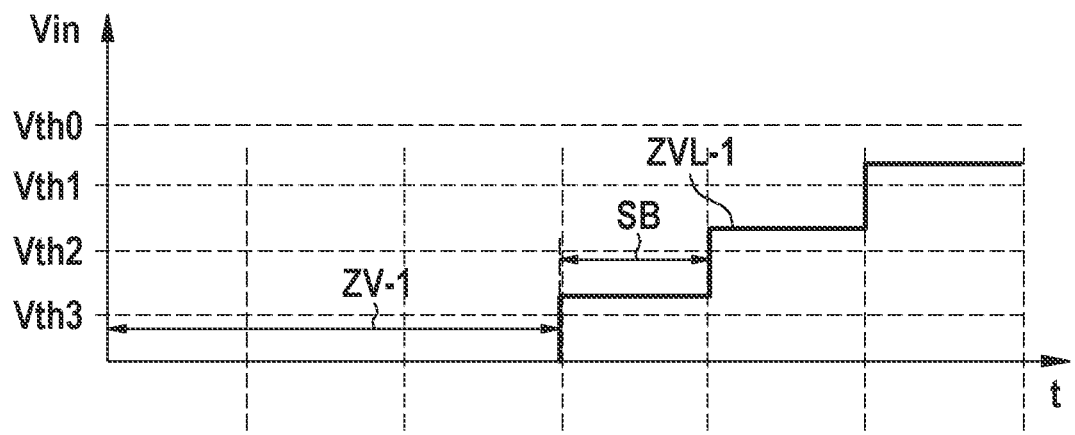
FIG. 30A schematically shows a time curve of a voltage according to exemplary embodiments of the present invention.

FIG. 30A schematically shows a time curve ZVL-1 of a voltage Vin that can be used as a control signal, for example first control signal AS-1, for example for application to the control electrode 110-1a (FIG. 2) of the first transistor 110-1 via the first memristive circuit device MR-1 according to further exemplary embodiments. The control signal shown in FIG. 30A has a first step width SB-1 (in the present case, for example, a "time step" t4-t3 (see labeled time axis t in FIG. 30B) and a non-vanishing first time offset ZV-1 of, in the present case, for example three time steps t3-t0, and characterizes for example a value "1" for the second input variable 110-1-E2.

Figure 30B:
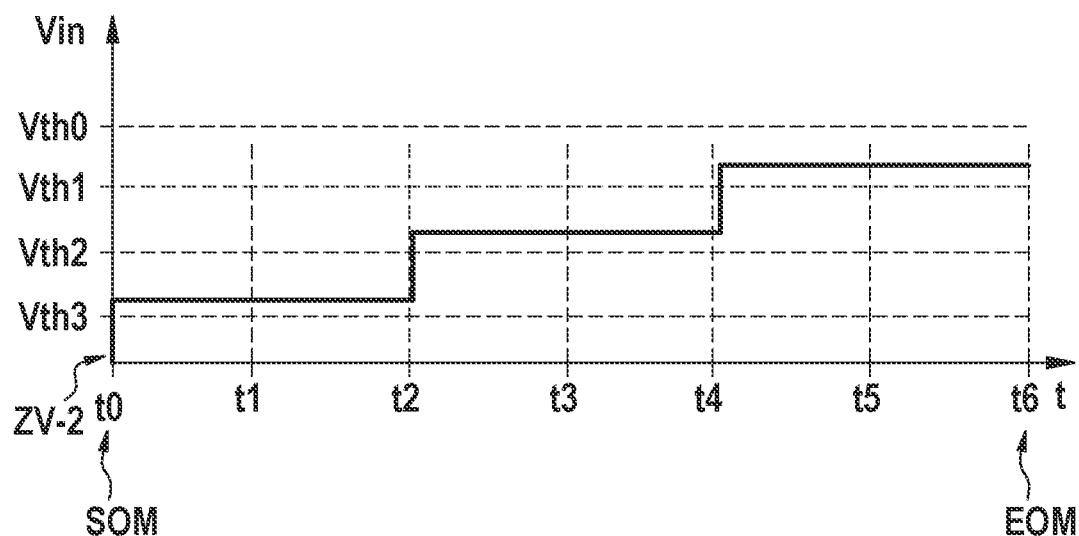
FIG. 30B schematically shows a time curve of a voltage according to exemplary embodiments of the present invention.

FIG. 30B schematically shows a time curve of a voltage Vin that can be used as a control signal, for example first control signal AS-1, for example for application to the control electrode 110-1a (FIG. 2) of the first transistor 110-1 via the first memristive circuit device MR-1 according to further exemplary embodiments. The control signal shown in FIG. 30B has a second step width (in the present case, for example two "time steps" t4-t2 and a vanishing second time offset ZV-2, and characterizes for example a value "2" for the second input variable 110-1-E2. In other words, the time curve according to FIG. 30B is "stretched" over time, in the present case by, as an example, the factor 2, in relation to the time curve ZVL-1 from FIG. 30A, which for example leads to twice the electrical charge being introduced into the capacitor 22 (FIG. 2) when the time curve according to FIG. 30B is used, corresponding to twice the value "2" for the second input variable, compared to the time curve ZVL-1 from FIG. 30A. In further exemplary embodiments, an n-fold value for the second input variable, e.g. compared to the time curve ZVL-1 of FIG. 30A, can thus be obtained by stretching the time curve ZVL-1 by the factor n (i.e., with an n-fold step width).

FIG. 31A, 31B, 31C, 31D each schematically show time curves of variables associated with the configuration according to FIG. 27, according to further exemplary embodiments. The elements ZV-1', ZV-2' symbolize time curves of the first control signals for the transistors 110-1, 110-2 according to FIG. 27 (which can be supplied via the corresponding memristive memory device MR-1, MR-2, e.g. from a reference time to which characterizes the start of a measurement, SOM, up to a time t3 which characterizes an end of the measurement, EOM), and the elements Vth2', Vth1' symbolize apparent threshold voltages of the transistors 110-1, 110-2 according to FIG. 27, as specifiable for example by the configuration, for example programming, of the corresponding memristive memory device MR-1, MR-2. Element SB 1 of FIG. 31B symbolizes a current limitation (e.g. realized by element SBE-1) for the first transistor 110-1 based on the first control signal for the first transistor 110-1, and element SB 2 of FIG. 31D symbolizes a current limitation (e.g. realized by element SBE-1) for the second transistor 110-2 based on the first control signal for the second transistor 110-2. The area C1 in FIG. 31B symbolizes a charge supplied to the capacitor 22 (FIG. 2) or to the analog-to-digital converter 20 of FIG. 27 by the first transistor 110-1, and the area C2 in FIG. 31D symbolizes a charge supplied to the capacitor 22 (FIG. 2) or the analog-to-digital converter 20 of FIG. 27 by the second transistor 110-2, based on the corresponding first control signals ZV-1', ZV-2' and the described current limitation.

Figure 32:
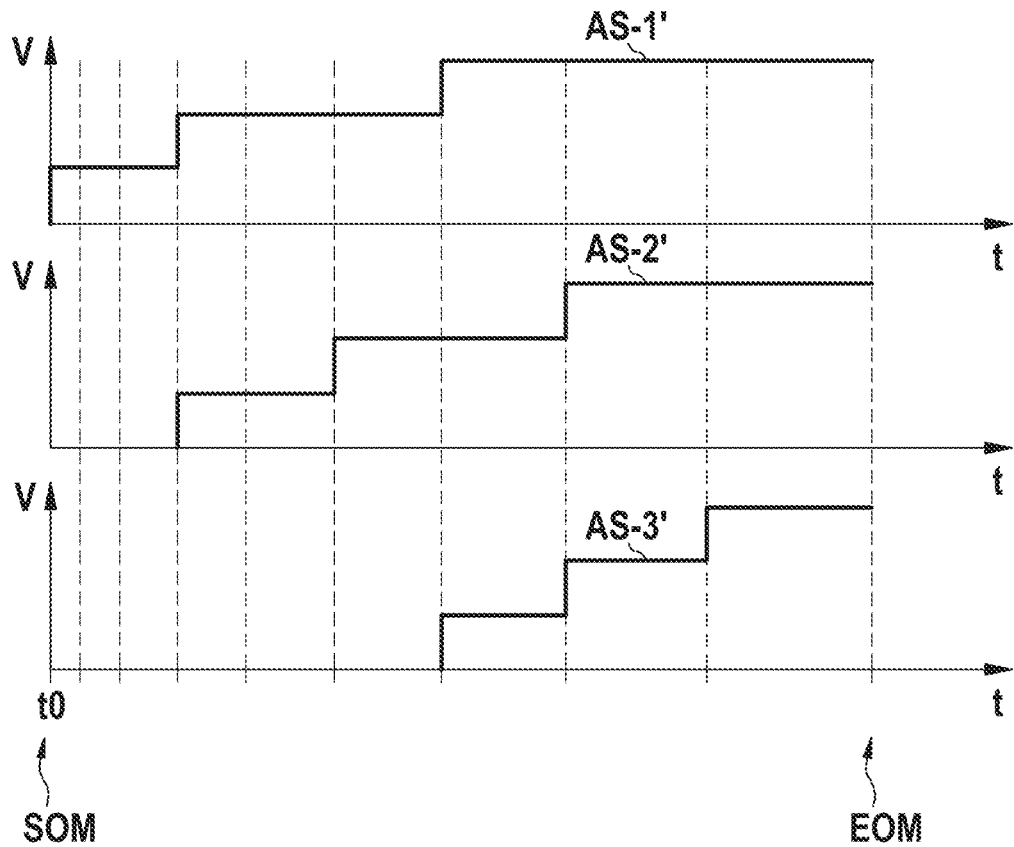
FIG. 32 schematically shows time curves according to further exemplary embodiments of the present invention.

FIG. 32 schematically shows time curves according to further exemplary embodiments, in which by way of example different step widths that change logarithmically over time are used for the stepped shape of the first control signals AS-1, 110-1-AS-1, 110-2-AS-1, . . . . The control signal AS-1' here corresponds for example to a first value for the second input variable 110-1-E2, the control signal AS-2' corresponds for example to a second value for the second input variable 110-1-E2, the control signal AS-3' corresponds for example to a third value for the second input variable 110-1-E2.

In further exemplary embodiments, logarithmically changing step widths over time can be used, for example if the capacitor 22 is to be charged not by means of e.g. constant currents (e.g. adjustable by the current-limiting elements SBE-1, SBE-2), but instead by means of a constant voltage. Here, the capacitor voltage can for example have a logarithmic time curve, and in some exemplary embodiments a measurement duration (e.g. characterizable by a difference EOM-SOM) can be shortened as a result.

Figure 33:
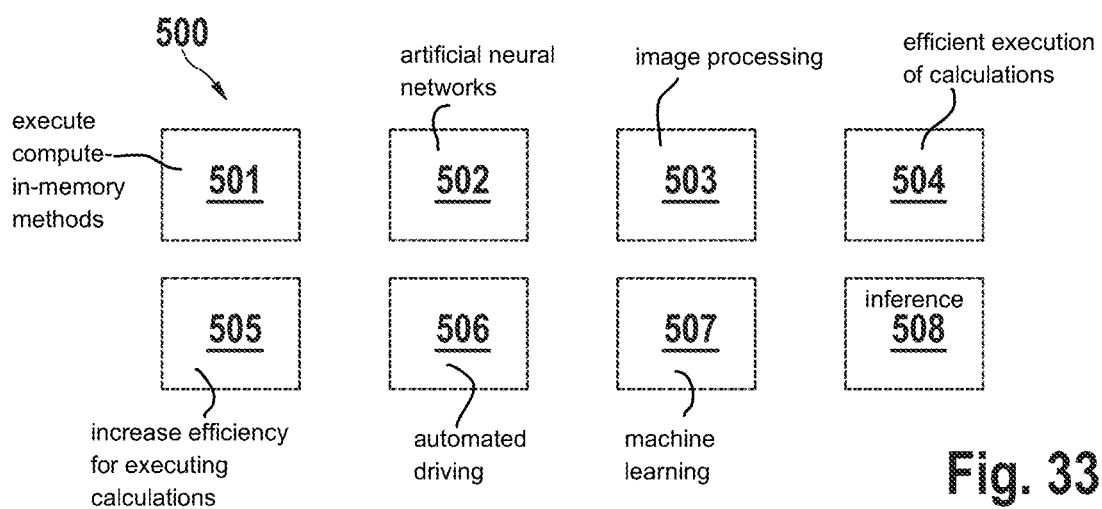
FIG. 33 schematically shows aspects of uses according to exemplary embodiments of the present invention.

Further exemplary embodiments, FIG. 33, relate to a use 500 of the method according to the embodiments and/or of the device 1000 according to the embodiments and/or of the computing device VMM according to the embodiments for at least one of the following elements: a) execution 501 of compute-in-memory methods, for example with weights and/or input variables, which can for example each have one or a plurality of bits; b) artificial neural networks 502, for example artificial deep neural networks; c) image processing 503; d) efficient execution 504 of calculations; e) increasing 505 an efficiency for the execution of calculations; f) automated driving 506; g) machine learning 507, for example inference 508.

Sponsorship and Support Information

The project that has led to this application was sponsored by the joint venture ECSEL (JU) within the framework of sponsorship agreement no. 826655. The JU is supported by the Horizon 2020 research and innovation program of the European Union and of Belgium, France, Germany, the Netherlands and Switzerland.

The invention claimed is:

1. A method for processing input variables using a processing device having at least a first transistor, comprising the following steps:
    providing the first transistor and a first memristive circuit device which characterizes a first input variable associated with the first transistor, wherein a charging current of a capacitance associated with a control electrode of the first transistor can be influenced using the first memristive circuit device;
    applying to the control electrode of the first transistor a first control signal which characterizes a second input variable associated with the first transistor and which has at least periodically a non-constant amplitude; and
    ascertaining a first output variable based on a first variable characterizing a time curve of a current through a load path of the first transistor.

2. The method according to claim 1, wherein the first variable is at least one of the following elements: a) the current through the load path itself; b) a voltage which can be ascertained based on at least the current through the load path.

3. The method according to claim 1, further comprising at least one of the following elements: a) using an intrinsic and/or parasitic capacitance of the first transistor, as the capacitance associated with the control electrode of the first transistor; b) providing an external, non-intrinsic, capacitance in addition to an intrinsic capacitance associated with the control electrode of the first transistor.

4. The method according to claim 1, further comprising:
    switching the first memristive circuit device in series with the control electrode of the first transistor;
    applying the first control signal to the control electrode of the first transistor via the first memristive circuit device.

5. The method according to claim 1, further comprising:
    providing a charging current for charging the capacitance associated with the control electrode of the first transistor using a charging device.

6. The method according to claim 1, further comprising:
providing an input voltage based on the second input variable;
applying the input voltage, via the first memristive circuit device, to the control electrode of the first transistor.

7. The method according to claim 1, further comprising:
ascertaining a first point in time at which the current through the load path of the first transistor exceeds a prespecifiable first threshold value; and
ascertaining the first output variable based on the first point in time.

8. The method according to claim 7, wherein the prespecifiable first threshold value corresponds to at least one of the following elements: a) saturation current of the first transistor; b) limit current to which the current through the load path of the first transistor can be limited and/or is limited; c) any prespecifiable current value.

9. The method according to claim 1, wherein the first control signal has at least one of the following time curves at least periodically: a) stepped shape; b) increasing monotonically.

10. The method according to claim 9, comprising at least one of the following elements: a) specifying a first slope for an increasing time curve of the first control signal for the first transistor; b) specifying a second slope for an increasing time curve of a first control signal for a second transistor; c) specifying a third slope for an increasing time curve of a first control signal for the third transistor, wherein the specifying of the first slope includes a specifying of the first slope based on the second input variable associated with the first transistor, wherein the specifying of the second slope includes a specifying of the second slope based on a second input variable associated with the second transistor, wherein the specifying of the third slope includes a specifying of the third slope based on a second input variable associated with the third transistor.

11. The method according to claim 1, wherein the processing device has at least one further transistor, wherein a corresponding first terminal of a load path of the first transistor and of the at least one further transistor is connected to a first circuit node, and wherein the method further comprises:
providing the at least one further transistor and a corresponding further memristive circuit device which characterizes a first input variable associated with the at least one further transistor, wherein a charging current of a capacitance associated with a control electrode of the at least one further transistor can be influenced using the corresponding further memristive element;
applying to a corresponding control electrode of the at least one further transistor a corresponding first control signal which characterizes a second input variable associated with the corresponding further transistor;
ascertaining the first output variable based on a second variable characterizing a time curve of a current associated with the first circuit node;
wherein the second variable is at least one of the following elements: a) the current itself associated with the first circuit node; b) a voltage that can be ascertained based on at least the current associated with the first circuit node.

12. The method according to claim 11, further comprising:
specifying a first step width for a stepped shape of the first control signal for the first transistor;
specifying a second step width for a stepped shape of a first control signal for a second transistor;
specifying a third step width for a stepped shape of a first control signal for a third transistor;
wherein the specifying of the first step width includes a specifying of the first step width based on the second input variable associated with the first transistor;
wherein the specifying of the second step width includes a specifying of the second step width based on the second input variable associated with the second transistor; and
wherein the specifying of the third step width includes a specifying of the third step width based on a second input variable associated with the third transistor.

13. The method according to claim 12, further comprising at least one of the following elements: a) specifying a first time offset with respect to a reference time, for applying the first control signal to the control electrode of the first transistor, wherein the specifying of the first time offset includes a specifying of the first time offset based on the second input variable associated with the first transistor; b) specifying a second time offset relative to the reference time, for applying the first control signal to the control electrode of the second transistor, wherein the specifying of the second time offset includes a specifying of the second time offset based on the second input variable associated with the second transistor; c) specifying a third time offset with respect to the reference time for applying the first control signal to a control electrode of the third transistor, wherein the specifying of the third time offset includes a specifying of the third time offset based on a second input variable associated with the third transistor.

14. The method according to claim 11, further comprising:
specifying a first constant amplitude value for the first control signal when the second input variable has a value smaller than a specifiable minimum value;
wherein the first amplitude value is smaller by a specifiable amount, than a smallest possible threshold voltage of at least one of the first and further transistors.

15. The method according to claim 11, further comprising at least one of the following elements: a) at least periodic limiting of a first current through the load path of the first transistor using a first current-limiting element including a resistor or a transistor configured as a resistor, wherein the limiting of the first current through the load path of the first transistor includes a limiting of the first current based on the second input variable associated with the first transistor; b) at least periodic limiting of a second current through the load path of the further transistor using a second current-limiting element including a resistor or a transistor configured as a resistor, wherein the limiting of the second current through the load path of the further transistor includes a limiting of the further current based on the second input variable associated with the further transistor.

16. The method according to claim 11, further comprising at least one of the following elements: a) specifying a first logarithmic step width which changes logarithmically over time, for a stepped shape of the first control signal for the first transistor; b) specifying a second logarithmic step width which changes logarithmically over time for a stepped shape of a first control signal for a second transistor; c) specifying a third logarithmic step width which changes logarithmically over time for a stepped shape of a first control signal for a third transistor, wherein the specifying of the first logarithmic step width is done based on the second input variable associated with the first transistor, wherein the specifying of the second logarithmic step width is done based on a second input variable associated with the second transistor, wherein the specifying of the third logarithmic step width is done based on a second input variable associated with the third transistor.

17. The method according to claim 1, wherein at least the first has a corresponding current-limiting function for limiting a current through its load path, wherein the current-limiting function is implemented using at least one of the following elements: a) a setting of a voltage for the control electrode of the first transistor such that a maximum specifiable current through the load path is not exceeded; b) a current-limiting element including a resistor or a transistor configured as a resistor, in series with the load path.

18. The method according to claim 1, further comprising: starting at least one of the following elements at a reference time: a) applying the first control signal to the control electrode of the first transistor; b) applying a corresponding first control signal to a corresponding control electrode of at least one further transistor; and ascertaining the output variable after a specifiable time period.

19. The method according to claim 1, wherein the first memristive circuit device includes a voltage divider with at least a first memristive element, wherein the application to the control electrode of the first transistor and/or a control electrode of at least one further transistor takes place using the voltage divider.

20. The method according to claim 1, wherein the method is used for at least one of the following elements: a) execution of compute-in-memory methods; b) artificial neural networks; c) image processing; d) efficient execution of calculations; e) increasing an efficiency for the execution of calculations; f) automated driving; g) machine learning.

21. A device for processing input variables, comprising: a processing device having at least a first transistor and a first memristive circuit device which characterizes a first input variable associated with the first transistor, wherein a charging current of a capacitance associated with a control electrode of the first transistor can be influenced using the first memristive circuit device;
wherein the device is configured to apply to the control electrode of the first transistor a first control signal which characterizes a second input variable associated with the first transistor and which has at least periodically a non-constant amplitude, and to ascertain a first output variable based on a first variable characterizing a time curve of a current through a load path of the first transistor.

22. The device according to claim 21, wherein, the processing device includes a number n of transistors, where n>1.

23. The device according to claim 21, wherein the processing device includes a plurality of transistors and a plurality of memristive circuit devices, wherein, each one of the plurality of memristive circuit devices is associated with a corresponding one of the plurality of transistors.

24. The device according to claim 21, wherein at least the first memristive circuit device includes at least one memristive element.

25. The device according to claim 24, wherein the at least one memristive element has one of the following types: a) memristor; b) resistive random access memory; c) phase change memory; d) metal oxide resistive memory; e) two-pole, memristive element.

26. The device according to claim 21, further comprising: at least one analog-to-digital converter.

27. The device according to claim 21, comprising: at least one capacitor which can be charged at least periodically using at least one current through at least one load path of at least one transistor.

28. The device according to claim 27, comprising: a discharging device configured to at least periodically discharging the capacitor.

29. The device according to claim 21, comprising: a programming device for programming at least one component of the first memristive circuit device and/or at least one component of at least one further memristive circuit device.

30. The device according to claim 21, further comprising at least one of the following elements: a) a first current-limiting element including a resistor or a transistor configured as a resistor, for at least periodically limiting a first current through the load path of the first transistor; b) a second current-limiting element including a resistor or a transistor configured as a resistor, for at least periodically limiting a second current through the load path of the second transistor.

31. The device according to claim 30, wherein a) the first current-limiting element is configured to limit the first current non-constantly over time based on the second input variable associated with the first transistor, and/or b) the second current-limiting element is configured to limit the second current non-constantly over time based on the second input variable associated with the second field-effect transistor.

32. The device according to claim 21, further comprising: at least one control device configured to provide, at least periodically, at least one of the following elements: a) the first control signal for the first transistor; b) the first control signal for the second transistor; c) the first control signal for a third transistor.

33. The device according to claim 21, further comprising: a control device configured to execute at least one of the following elements control of at least one component of the device.

34. A computing device, comprising:
at least one device for processing input variables, including:
a processing device having at least a first transistor and a first memristive circuit device which characterizes a first input variable associated with the first transistor, wherein a charging current of a capacitance associated with a control electrode of the first transistor can be influenced using the first memristive circuit device;
wherein the device is configured to apply to the control electrode of the first transistor a first control signal which characterizes a second input variable associated with the first transistor and which has at least periodically a non- constant amplitude, and to ascertain a first output variable based on a first variable characterizing a time curve of a current through a load path of the first transistor.

* * * * *